United States Patent
Jun et al.

(10) Patent No.: US 12,557,263 B2
(45) Date of Patent: Feb. 17, 2026

(54) SEMICONDUCTOR DEVICES

(71) Applicant: Samsung Electronics Co., Ltd., Suwon-si (KR)

(72) Inventors: Jihee Jun, Suwon-si (KR); Injae Bae, Suwon-si (KR); Jihoon Chang, Suwon-si (KR); Dongsik Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 273 days.

(21) Appl. No.: 18/449,989

(22) Filed: Aug. 15, 2023

(65) Prior Publication Data

US 2024/0098964 A1    Mar. 21, 2024

(30) Foreign Application Priority Data

Sep. 19, 2022    (KR) .................. 10-2022-0118039

(51) Int. Cl.
*H10B 12/00*    (2023.01)
*H10D 1/68*    (2025.01)

(52) U.S. Cl.
CPC ....... *H10B 12/038* (2023.02); *H10B 12/0335* (2023.02); *H10B 12/482* (2023.02); *H10D 1/692* (2025.01)

(58) Field of Classification Search
CPC .......... H10B 12/038; H10B 12/0335; H10B 12/482; H10B 12/00; H10B 12/05; H10B 12/315; H10B 12/485; H10B 12/50; H10D 1/692

See application file for complete search history.

(56) References Cited

U.S. PATENT DOCUMENTS

| | | | |
|---|---|---|---|
| 7,745,864 B2 * | 6/2010 | Koo | ......... H01L 21/76897 |
| | | | 257/306 |
| 8,530,324 B2 | 9/2013 | Park et al. | |
| 8,791,526 B2 | 7/2014 | Yoon et al. | |
| 9,041,202 B2 | 5/2015 | Kimura | |
| 9,177,872 B2 | 11/2015 | Sandhu | |
| 10,157,926 B2 | 12/2018 | Yang et al. | |
| 2022/0037326 A1 | 2/2022 | Han | |
| 2022/0122980 A1 | 4/2022 | Han et al. | |

FOREIGN PATENT DOCUMENTS

KR    101360947 B1    2/2014

* cited by examiner

*Primary Examiner* — David Vu
(74) *Attorney, Agent, or Firm* — Harness, Dickey & Pierce, P.L.C.

(57) ABSTRACT

A semiconductor device includes a S/A circuit, bit lines, a gate electrode, a gate insulation pattern, a channel, an upper contact plug and a capacitor on a substrate. The bit lines includes first, second, third and fourth bit lines sequentially arranged in the second direction. A first lower contact plug, a first lower wiring and a second lower contact plug are sequentially stacked in a third direction between the S/A circuit and the first bit line, and are electrically connected to the S/A circuit and the first bit line. A third lower contact plug, a second lower wiring and a fourth lower contact plug are sequentially stacked in the third direction between the S/A circuit and the third bit line, and are electrically connected to the S/A circuit and the third bit line. The first and second lower wirings are at different levels from each other.

20 Claims, 26 Drawing Sheets

SEMICONDUCTOR DEVICES

CROSS-REFERENCE TO RELATED APPLICATION

This application claims priority under 35 U.S.C. § 119 to Korean Patent Application No. 10-2022-0118039 filed on Sep. 19, 2022 in the Korean Intellectual Property Office, the disclosure of which is hereby incorporated by reference in its entirety.

BACKGROUND

Various example embodiments relate to a semiconductor device. More particularly, various example embodiments relate to a memory device including a vertical channel.

Recently, a memory device including a vertical channel transistor has been developed. The memory device may include small or minute patterns in order to increase the integration degree of the memory device, and a photolithography process for forming the minute patterns may have a high level of difficulty.

SUMMARY

Some example embodiments provide a semiconductor device having improved characteristics.

According to various example embodiments, there is provided a semiconductor device. The semiconductor device may include a sense amplifier (S/A) circuit, bit lines, a gate electrode, a gate insulation pattern, a channel, an upper contact plug and a capacitor. The S/A circuit may be on a substrate. The bit lines may be on the S/A circuit, and each of the bit lines may extend in a first direction substantially parallel to an upper surface of the substrate. The bit lines may be spaced apart from each other in a second direction that is substantially parallel to the upper surface of the substrate and that crosses the first direction. The gate electrode may extend in the second direction on the bit lines. The gate insulation pattern may be on a sidewall in the first direction of the gate electrode. The channel may be on a sidewall in the first direction of the gate insulation pattern. The channel may contact a corresponding one of the bit lines, and may include an oxide semiconductor material. The upper contact plug may contact an upper surface of the channel. The capacitor may be on the upper contact plug. The bit lines may include first, second, third and fourth bit lines sequentially arranged in the second direction. A first lower contact plug, a first lower wiring and a second lower contact plug may be sequentially stacked between the S/A circuit and the first bit line in a third direction substantially perpendicular to the upper surface of the substrate, and the first lower contact plug, the first lower wiring and the second lower contact plug may be electrically connected to the S/A circuit and the first bit line. A third lower contact plug, a second lower wiring and a fourth lower contact plug may be sequentially stacked in the third direction between the S/A circuit and the third bit line, and the third lower contact plug, the second lower wiring and the fourth lower contact plug may be electrically connected to the S/A circuit and the third bit line. The first and second lower wirings may be arranged at different levels from each other.

According to various example embodiments, there is provided a semiconductor device. The semiconductor device may include a sense amplifier (S/A) circuit, bit lines, a gate electrode, a gate insulation pattern, a channel, an upper contact plug, and a capacitor. The S/A circuit may be on a substrate. The bit lines may be on the S/A circuit, and each of the bit lines may extend in a first direction substantially parallel to an upper surface of the substrate. The bit lines may be spaced apart from each other in a second direction that is substantially parallel to the upper surface of the substrate and that crosses the first direction. The gate electrode may extend in the second direction on the bit lines. The gate insulation pattern may be on a sidewall in the first direction of the gate electrode. The channel may be on a sidewall in the first direction of the gate insulation pattern. The channel may contact a corresponding one of the bit lines, and include an oxide semiconductor material. The upper contact plug may contact an upper surface of the channel. The capacitor may be on the upper contact plug. The bit lines may include first, second, third, and fourth bit lines sequentially arranged in the second direction. A first conductive structure may be between the S/A circuit and the first bit line, and the first conductive structure may electrically connect the S/A circuit and the first bit line. A second conductive structure may be between the S/A circuit and the second bit line, and the second conductive structure may electrically connect the S/A circuit and the second bit line. The first conductive structure may include a first lower contact plug contacting a lower surface of the first bit line, and a first lower wiring contacting a lower surface of the first lower contact plug. The second conductive structure may include a second lower contact plug contacting a lower surface of the second bit line, and a second lower wiring contacting a lower surface of the second lower contact plug. Lengths in the third direction of the first and second lower contact plugs may be different from each other.

According to various example embodiments, there is provided a semiconductor device. The semiconductor device may include a sense amplifier (S/A) circuit, bit lines, conductive structures, gate electrodes, a gate insulation pattern, a channel, upper contact plugs and capacitors. The S/A circuit may be on a substrate, and may include transistors spaced apart from each other in a second direction substantially parallel to an upper surface of the substrate. The bit lines may be on the S/A circuit, and each of the bit lines may extend in a first direction substantially parallel to the upper surface of the substrate and crossing the second direction. The bit lines may be spaced apart from each other in the second direction. The conductive structures may be between the transistors and the bit lines, respectively, and may electrically connect the transistors to the bit lines, respectively. The gate electrodes may be spaced apart from each other in the first direction on the bit lines, and each of the gate electrodes may extend in the first direction. The gate insulation pattern may be on a sidewall in the first direction of each of the gate electrodes. The channel may be on a sidewall in the first direction of the gate insulation pattern. The channel may contact a corresponding one of the bit lines, and may include an oxide semiconductor material. The upper contact plugs may contact upper surfaces of the channels, respectively. The capacitors may be on the upper contact plugs, respectively. Each of the conductive structure may include a lower contact plug contacting a lower surface of each of the bit lines, and a lower wiring contacting a lower surface of the lower contact plug. Ones of the lower wirings may be disposed at different levels from each other.

In various method of manufacturing the semiconductor device in accordance various example embodiments, the lower wirings between the S/A circuit and the bit lines may be formed at different levels from each other, and thus a photolithography process for forming the lower wirings may be more easily performed.

Alternatively or additionally, as the number of the lower wirings at the same level decreases, the freedom of layout of the lower wirings may increase, and the lower wirings may have large widths so as to have reduced resistances and/or improved operating speed.

DETAILED DESCRIPTION

The above and other aspects and features of a semiconductor device and a method of manufacturing the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Hereinafter, in the specification (and not necessarily in the claims), two horizontal directions substantially parallel to an upper surface of a substrate may be referred to as first and second directions D1 and D2, respectively, and a vertical direction substantially perpendicular to the upper surface of the substrate may be referred to as a third direction D3. In various example embodiments, the first and second directions are substantially perpendicular to each other.

Figure 1:
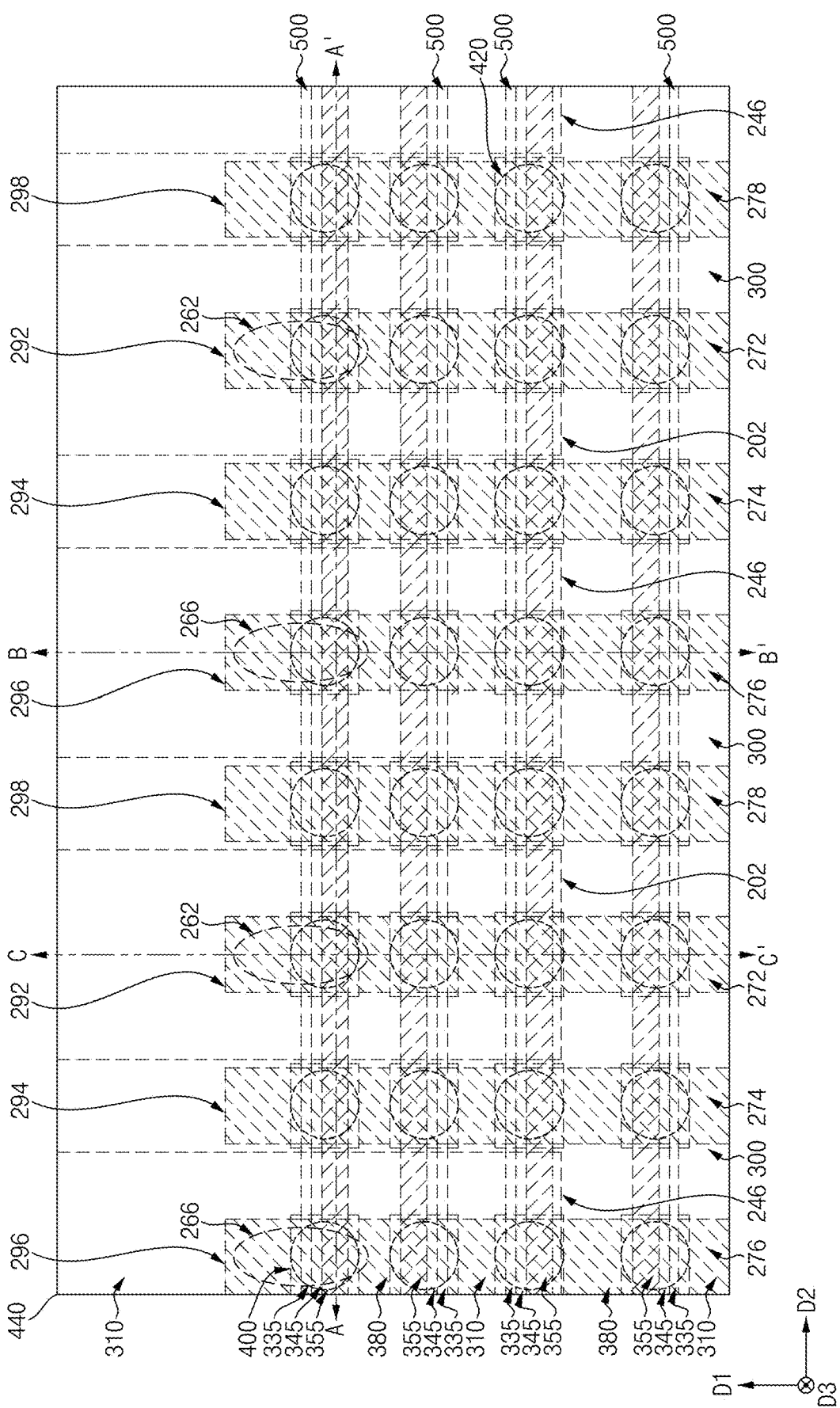
FIGS. 1 to 4 are a plan view and cross-sectional views illustrating a semiconductor device according to some example embodiments.
Figure 2:
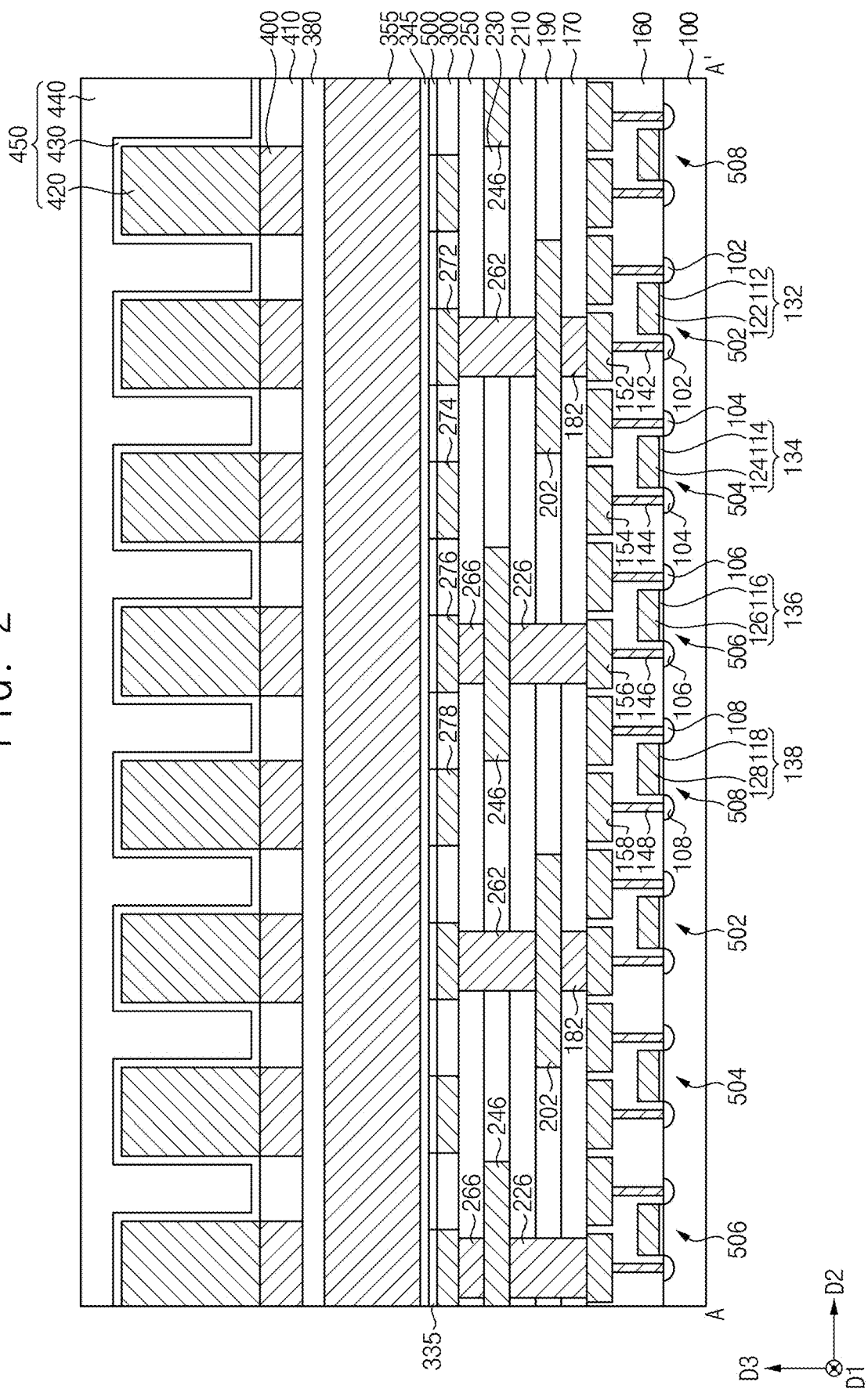
Figure 3:
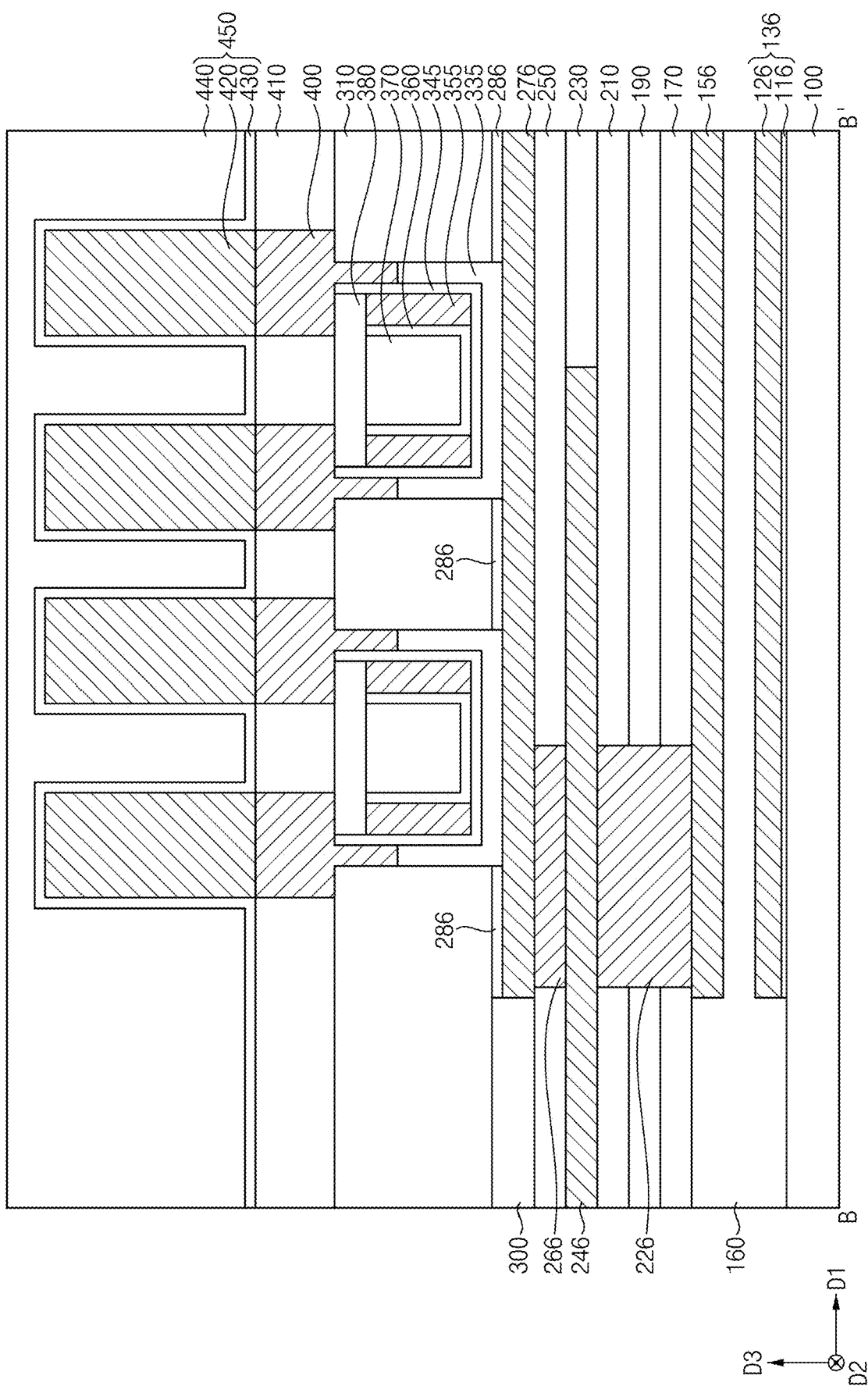
Figure 4:
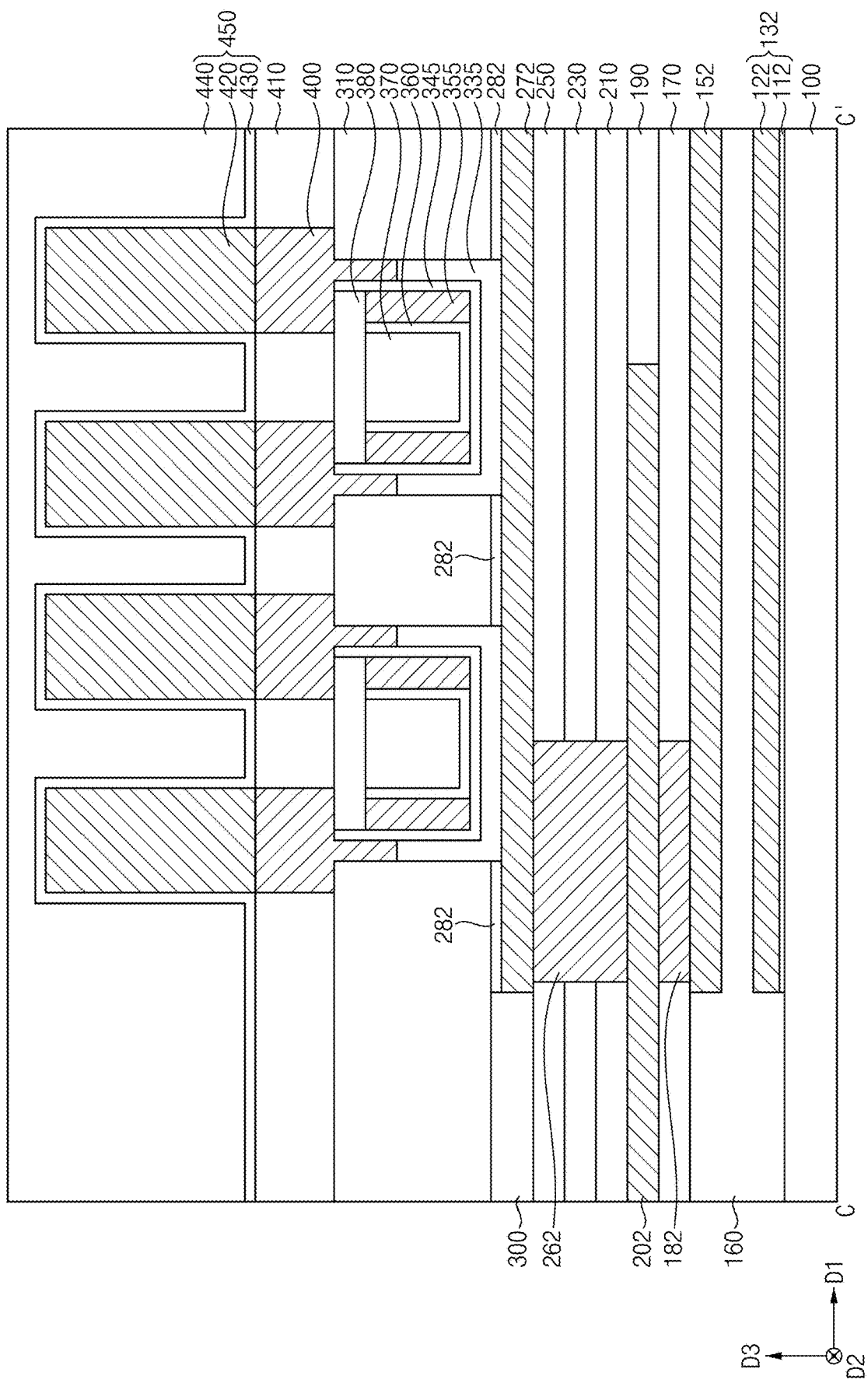

FIGS. 1 to 4 are a plan view and cross-sectional views illustrating a semiconductor device according to example embodiments. Particularly, FIG. 1 is the plan view, FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 to 4, the semiconductor device may include a lower circuit pattern, first to fourth bit line structures 292, 294, 296 and 298, an upper gate electrode 355, an upper gate insulation pattern 345, a channel 335, an upper contact plug 400 and a capacitor 450 on a substrate 100.

The semiconductor device may further include first to sixth lower insulation layers 160, 170, 190, 210, 230 and 250, first to fourth upper insulating interlayer patterns 300, 310, 370 and 410, and fifth, sixth and eleventh insulation patterns 360, 380 and 500.

The substrate 100 may include, e.g., one or more of a semiconductor material, an insulation material or a conductive material.

Referring to FIGS. 1 to 4 together with FIGS. 5 to 10, the lower circuit pattern may include, e.g., transistors, lower contact plugs, lower wirings, etc. In various example embodiments, the lower circuit pattern may include transistors included in a sense amplifier (S/A) circuit, and lower contact plugs and lower wirings electrically connected to the transistors of the S/A circuit. The transistors may be planar and/or three-dimensional, may be NMOS transistors or PMOS transistors, may have a thin gate oxide or may have a thick gate oxide, and/or may have various threshold voltages.

Figure 10:
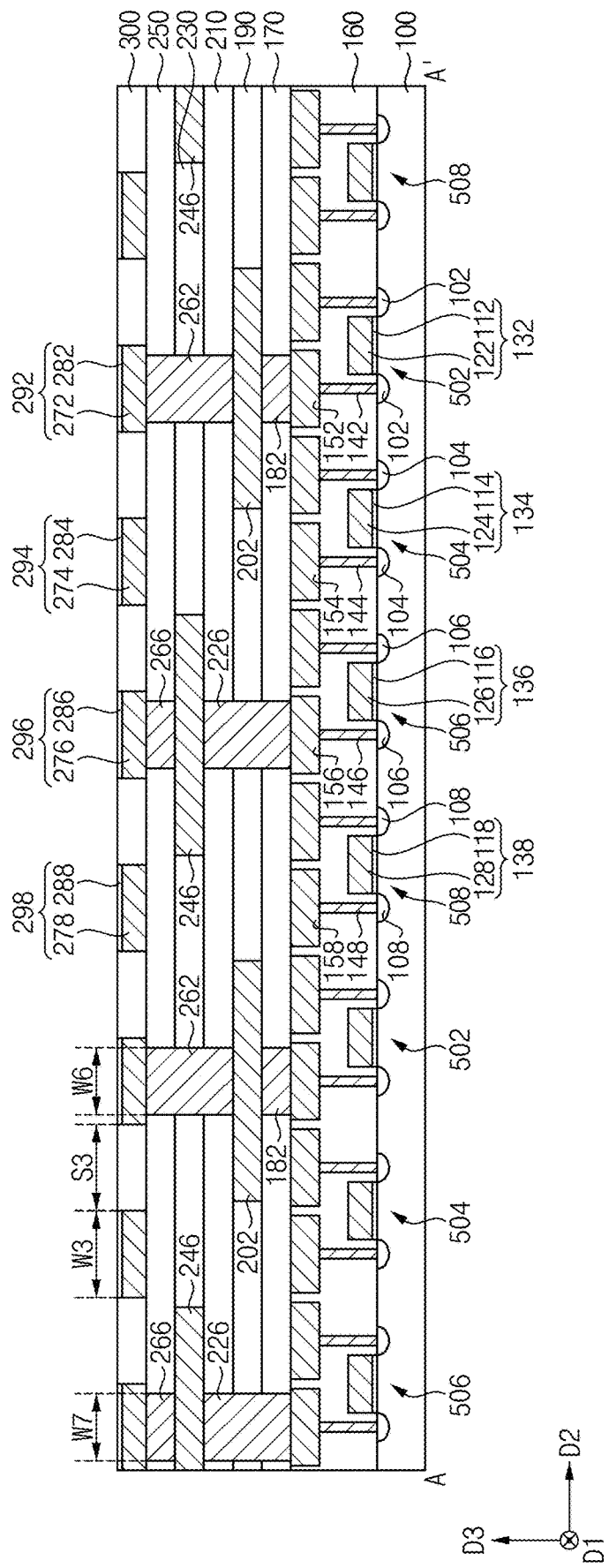

FIG. 10 shows first to fourth transistors 502, 504, 506 and 508, first to eighth lower contact plugs 142, 144, 146, 148, 182, 226, 262 and 266, and first to sixth lower wirings 152, 154, 156, 158, 202 and 246, however, inventive concepts may not be limited thereto.

The first bit line structure 292 may include a first bit line 272 and a first insulation pattern 282 stacked in the third direction D3, the second bit line structure 294 may include a second bit line 274 and a second insulation pattern 284 stacked in the third direction D3, the bit line structure 296 may include a third bit line 276 and a third insulation pattern 286 stacked in the third direction D3, and the fourth bit line structure 298 may include a fourth bit line 278 and a fourth insulation pattern 288 stacked in the third direction D3.

In various example embodiments, the first to fourth transistors 502, 504, 506 and 508 may be repeatedly formed or arranged sequentially, e.g. in the second direction D2 in this order, and the first to fourth bit line structures 292, 294, 296 and 298 may be repeatedly formed in the second direction D2 in this order.

In various example embodiments, each of the first to fourth bit lines 272, 274, 276 and 278 may extend in the first direction D1, and may have a third width W3 in the second direction D2. A plurality of first insulation patterns 282 may be spaced apart from each other in the first direction D1 on the first bit line 272, a plurality of second insulation patterns 284 may be spaced apart from each other in the first direction D1 on the second bit line 274, a plurality of third insulation patterns 286 may be spaced apart from each other in the first direction D1 on the third bit line 276, and a plurality of fourth insulation patterns 288 may be spaced apart from each other in the first direction D1 on the fourth bit line 278.

FIG. 1 shows an end portion in the first direction D1 of each of the first to fourth bit line structures 292, 294, 296 and 298, which may be referred to as a first end portion of each of the first to fourth bit line structures 292, 294, 296 and 298. Another end portion in the first direction D1 of each of the first to fourth bit line structures 292, 294, 296 and 298 may be referred to as a second end portion of thereof.

Neighboring ones of the first to fourth bit line structures 292, 294, 296 and 298 in the second direction D2 may be spaced apart from each other by a third distance S3, e.g. by a constant third distance S3.

Each of the first to fourth bit lines 272, 274, 276 and 278 may include one or more of e.g., a metal, a metal nitride, a metal silicide, etc., and each of the first to fourth insulation patterns 282, 284, 286 and 288 may include an insulating nitride, e.g., silicon nitride.

The first transistor 502 may include a first lower gate structure 132 having a first lower gate insulation pattern 112 and a first lower gate electrode 122, and a first impurity region 102 at an upper portion of the substrate 100 adjacent to the first lower gate structure 132. The second transistor 504 may include a second lower gate structure 134 having a second lower gate insulation pattern 114 and a second lower gate electrode 124, and a second impurity region 104 at an upper portion of the substrate 100 adjacent to the second lower gate structure 134. The third transistor 506 may include a third lower gate structure 136 having a third lower gate insulation pattern 116 and a third lower gate electrode 126, and a third impurity region 106 at an upper portion of the substrate 100 adjacent to the third lower gate structure 136. The fourth transistor 508 may include a fourth lower gate structure 138 having a fourth lower gate insulation pattern 118 and a fourth lower gate electrode 128, and a fourth impurity region 108 at an upper portion of the substrate 100 adjacent to the fourth lower gate structure 138.

In various example embodiments, each of the first to fourth lower gate structures 132, 134, 136 and 138 may extend in the first direction D1.

Each of the first to fourth impurity regions 102, 104, 106 and 108 may include silicon, such as polysilicon, doped with, e.g., n-type impurities. Alternatively or additionally, each of the first to fourth lower gate insulation patterns 112, 114, 116 and 118 may include an oxide, e.g., silicon oxide. Alternatively or additionally, each of the first to fourth lower gate electrodes 122, 124, 126 and 128 may include, e.g., one or more of a metal, a metal nitride, a metal silicide, etc.

The first to fourth lower contact plugs 142, 144, 146 and 148 may contact upper surfaces of the first to fourth impurity regions 102, 104, 106 and 108, respectively, and the first to fourth lower wirings 152, 154, 156 and 158 may contact upper surfaces of the first to fourth lower contact plugs 142, 144, 146 and 148, respectively.

In various example embodiments, each of the first to fourth lower wirings 152, 154, 156 and 158 may extend in the first direction D1.

In various example embodiments, the fifth lower contact plug 182, the fifth lower wiring 202 and the seventh lower contact plug 262 may be sequentially stacked on the first lower wiring 152 in the third direction D3 to be electrically connected to the first bit line 272, and thus the first transistor 502 may be electrically connected to the first bit line 272. Additionally, the sixth lower contact plug 226, the sixth lower wiring 246 and the eighth lower contact plug 266 may be sequentially stacked on the third lower wiring 156 in the third direction D3 to be electrically connected to the third bit line 276, and thus the third transistor 506 may be electrically connected to the third bit line 276.

The fifth and sixth lower wirings 202 and 246 may have first and second widths W1 and W2, respectively, in the second direction D2. In various example embodiments, the first and second widths W1 and W2 may be greater than the third width W3. The first width W1 may be equal to, or different from (e.g. greater than or less than) the second width W2.

The fifth lower wirings 202 may be spaced apart from each other in the second direction D2 by a first distance S1, and the sixth lower wirings 246 may be spaced apart from each other in the second direction D2 by a second distance S2. In various example embodiments, the first and second distances S1 and S2 may be greater than the first and second widths W1 and W2, respectively.

The fifth to eighth lower contact plugs 182, 226, 262 and 266 may have fourth to seventh widths W4, W5, W6 and W7 respectively, in the second direction D2. In various example embodiment, the fourth to seventh widths W4, W5, W6 and W7 may be less than the third width W3. The fourth to seventh widths W4 to W7 may be equal to or different from each other.

In various example embodiments, the fifth lower wiring 202 electrically connected to the first lower contact plug 152 and the first bit line 272 may be formed or arranged at a level different from (e.g. below) a level of the sixth lower wiring 246 electrically connected to the third lower wiring 156 and the third bit line 276.

Thus, when compared to a case in which the fifth and sixth lower wirings 202 and 246 are formed at a same level as each other, a photolithography process for forming the fifth and sixth lower wirings 202 and 246 may be more easily performed, and the freedom of layout of the fifth and sixth lower wirings 202 and 246 may increase. Additionally or alternatively, the fourth and fifth widths W4 and W5 of the fifth and sixth lower wirings 202 and 246. respectively, may have relatively large values, and thus the fifth and sixth lower wirings 202 and 246 may have decreased resistances.

A length in the third direction D3 of the seventh lower contact plug 262 connecting the fifth lower wiring 202 to the first bit line 272 may be different from a length in the third direction D3 of the eighth lower contact plug 266 connecting the sixth lower wiring 246 to the third bit line 276. Likewise, a length in the third direction D3 of the fifth lower contact plug 182 connecting the first lower wiring 152 to the fifth lower wiring 202 may be different from a length in the third direction D3 of the sixth lower contact plug 226 connecting the third lower wiring 156 to the sixth lower wiring 246.

In various example embodiments, the first and third transistors 502 and 506 may be electrically connected to the first end portions in the first direction D1 of the first and third bit lines 272 and 276, respectively, and the second and fourth transistors 504 and 508 may not be electrically connected to the first end portions in the first direction D1 of the second and fourth bit lines 274 and 278, respectively.

The first to sixth lower insulating interlayers 160, 170, 190, 210, 230 and 250 may be sequentially stacked in the third direction D3 on the substrate 100.

The first lower insulating interlayer 160 may cover the first to fourth transistors 502, 504, 506 and 508, and the first to fourth lower contact plugs 142, 144, 146 and 148, and may surround sidewalls of the first to fourth lower wirings 152, 154, 156 and 158.

The fifth lower contact plug 182 may extend through the second insulating interlayer 170. The fifth lower wiring 202 may extend through the third lower insulating interlayer 190. The sixth lower contact plug 226 may extend through the second to fourth lower insulating interlayers 170, 190 and 210. The sixth lower wiring 246 may extend through the fifth lower insulating interlayer 230. The seventh lower contact plug 262 may extend through the fourth to sixth insulating interlayers 210, 230 and 250. The eighth lower contact plug 266 may extend through the sixth insulating interlayer 250.

Each of the first to sixth lower insulating interlayers 160, 170, 190, 210, 230 and 250 may include one or more of an oxide, e.g., silicon oxide, or a low-k dielectric material.

Sidewalls in the second direction D2 and the first end portions in the first direction D1 of the first to fourth bit line structures 292, 294, 296 and 298 may be covered by the first upper insulating interlayer pattern 300. The first upper insulating interlayer pattern 300 may include an oxide, e.g., silicon oxide.

The second upper insulating interlayer pattern 310 may extend in the second direction D2 on the first to fourth insulation patterns 282, 284, 286 and 288 and the first upper insulating interlayer pattern 300. The second upper insulating interlayer pattern 310 may include an oxide, e.g., silicon oxide.

Hereinafter, the second upper insulating interlayer pattern 310, the first to fourth insulation patterns 282, 284, 286 and 288 and an upper portion. of the first upper insulating interlayer pattern 300 at the same level as the first to fourth insulation patterns 282., 284, 286 and 288 may be collectively referred to as a bar structure. The bar structure may extend in the second direction D2, and a plurality of bar structures may be spaced apart from each other in the first direction D1. A second opening 320 (refer to FIG. 12) extending in the second direction D2 and exposing upper surfaces of the first to fourth bit lines 272, 274, 276 and 278 and the first upper insulating interlayer pattern 300 may be formed between the bar structures.

The channel 335 may be formed between the bar structures, and a plurality of channels 335 may be spaced apart from each other in the second direction D2 on the first to fourth bit lines 272, 274, 276 and 278 and the first upper insulating interlayer pattern 300. The eleventh insulation pattern 500 may be formed between neighboring ones of the channels 335 in the second direction D2. The eleventh insulation pattern 500 may include an oxide, e.g., silicon oxide and/or an insulating nitride, e.g., silicon nitride.

A plurality of channels 335 may be spaced apart from each other in the first direction D1 on each of the first to fourth bit lines 272, 274, 276 and 278 extending in the first direction D1. FIG. 2 shows that a width in the second direction D2 of each of the channels 335 is substantially the same as a width in the second direction D2 of each of the first to fourth bit lines 272, 274, 276 and 278, however, the inventive concept may not be limited thereto.

In various example embodiments, the channel 335 may be conformally formed on upper surfaces of the first to fourth bit lines 272, 274, 276 and 278, and on a sidewall of the bar structure. Thus, in various example embodiments, a cross-section in the first direction D1 of the channel 335 may have a cup shape. Alternatively or additionally, a cross-section in the first direction D1 of the channel 335 may have an "L" shape.

In various example embodiments, the channel 335 may include an oxide semiconductor material. The oxide semiconductor material may include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), alutninum zinc tin oxide ($Al_xZn_ySnO_a$), gallium zinc tin oxide ($Ga_xIn_ySn_zO_a$), zirconium zinc tin oxide ($Zr_xZn_ySn_zO_a$), and indium gallium silicon oxide (InGaSiO).

Alternatively or additionally, in various example embodiments, the channel 335 may include amorphous oxide semiconductor material. In various example embodiments, an upper surface of the channel 335 may be lower than an upper surface of the bar structure. Alternatively or additionally, the upper surface of the channel 335 may be substantially coplanar with the upper surface of the bar structure.

The third upper insulating interlayer pattern 370 may be formed on a portion of the channel 335 on the first to fourth bit lines 272, 274, 276 and 278 and the first upper insulating interlayer pattern 300 between the bar structures, and may extend in the second direction D2. A lower surface and a sidewall of the first upper insulating interlayer pattern 300 may be covered by the fifth insulation pattern 360. A cross-section in the first direction D1 of the fifth insulation pattern 360 may have a cup shape, and may contact an upper surface of the portion of the channel 335 on the first to fourth bit lines 272, 274, 276 and 278 and the first upper insulating interlayer pattern 300, and/or a sidewall of the channel 335.

The third upper insulating interlayer pattern 370 may include an oxide, e.g., silicon oxide, and may or may not include a nitride, and the fifth insulation pattern 360 may include an insulating nitride, e.g., silicon nitride, and may or may not include an oxide.

The upper gate insulation pattern 345 and the upper gate electrode 355 may be formed between a portion of the channel 335 on a sidewall of the bar structure and the fifth insulation pattern 360.

The upper gate electrode 355 may contact an outer sidewall of the fifth insulation pattern 360, and may extend in the second direction D2. An upper surface of the upper gate electrode 355 may be substantially coplanar with upper surfaces of the third upper insulating interlayer pattern 370 and the fifth insulation pattern 360. The upper gate electrode 355 may include, e.g., one or more of a metal, a metal nitride, a metal silicide.

The upper gate insulation pattern 345 may cover a lower surface and an outer sidewall of the upper gate electrode 355, and may extend in the second direction D2. Additionally, the upper gate insulation pattern 345 may contact an inner sidewall of the portion of the channel 335 on the sidewall of the bar structure, a sidewall of a lower portion of the upper contact plug 400, and an upper surface of the portion of the channel 335 on the first to fourth bit lines 272, 274, 276 and 278 and the first upper insulating interlayer pattern 300. Thus, a cross-section in the first direction D1 of the upper gate insulation pattern 345 may have a cup shape.

In various example embodiments, an upper surface of the upper gate insulation pattern 345 may be substantially coplanar with an upper surface of the second upper insulating interlayer pattern 310 included in the bar structure. The upper gate insulation pattern 345 may include a metal oxide, e.g., one or more of aluminum oxide, hafnium oxide, zirconium oxide, etc., or silicon oxide.

The sixth insulation pattern 380 may be formed on the third upper insulating interlayer pattern 370, the fifth insulation pattern 360 and the upper gate electrode 355, and may extend in the second direction D2. The sixth insulation pattern 380 may contact the upper surfaces of the third upper insulating interlayer pattern 370, the fifth insulation pattern 360 and the upper gate electrode 355, and an upper inner sidewall of the upper gate insulation pattern 345.

In various example embodiments, an upper surface of the sixth insulation pattern 380 may be substantially coplanar with the upper surface of the upper gate insulation pattern 345 or the upper surface of the second upper insulating interlayer pattern 310. The sixth insulation pattern 380 may include an insulating nitride, e.g., silicon nitride.

The upper contact plug 400 may contact an upper surface of the channel 335 at each of areas where the first to fourth bit lines 272, 274, 276 and 278 and the upper gate electrodes 355 cross each other in the third direction D3. The upper contact plug 400 may also contact upper surfaces of portions of the upper gate insulation pattern 345, the second upper insulating interlayer pattern 310 and the sixth insulation pattern 380 adjacent to the channel 335. The upper contact plug 400 may not contact the upper surface of the upper gate electrode 355, but may be spaced apart from the upper gate electrode 355 by the sixth insulation pattern 380 and the upper gate insulation pattern 345.

In various example embodiments, the upper contact plug 400 may include a lower portion that may be formed in a second recess 390 (refer to FIG. 19) between the second upper insulating interlayer pattern 310 included in the bar structure and the upper gate insulation pattern 345, and an upper portion on the lower portion. The lower portion of the upper contact plug 400 may have an area less than an area of the upper portion of the upper contact plug 400.

In various example embodiments, a plurality of upper contact plugs 400 may be spaced apart from each other in the first and second directions D1 and D2, and may be arranged in a lattice pattern or a honeycomb pattern in a plan view. The upper contact plug 400 may include, e.g., one or more of a metal, a metal nitride, a metal silicide, etc.

The fourth upper insulating interlayer pattern 410 may be formed on the second upper insulating interlayer pattern 310, the channel 335, the upper gate insulation pattern 345 and the sixth insulation pattern 380, and may cover a sidewall of the upper contact plug 400. The fourth upper insulating interlayer pattern 410 may include an oxide, e.g., silicon oxide.

The capacitor 450 may include first and second capacitor electrodes 420 and 440, and a dielectric layer 430 between the first and second capacitor electrodes 420 and 440. The first capacitor electrode 420 may be formed on the upper contact plug 400, the dielectric layer 430 may be formed on an upper surface and a sidewall of the first capacitor electrode 420 and an upper surface of the fourth upper insulating interlayer pattern 410. The second capacitor electrode 440 may be formed on the dielectric layer 430.

In some example embodiments, the capacitor 450 may be a passive capacitor. Alternatively or additionally, in some example embodiments the capacitor 450 may be replaced with a memristor and/or other electrical component. For example, the capacitor 450 may be replaced with an electrical device having some hysteresis properties. In some example embodiments, the capacitor 450 may be replaced with an electrical device that maintains memory even without power being supplied. However, example embodiments are not limited thereto.

As the plurality of upper contact plugs 400 are spaced apart from each other in the first and second directions D1 and D2, a plurality of first capacitor electrodes 420 may be spaced apart from each other in the first and second directions D1 and D2.

In various example embodiments, the first capacitor electrode 420 may have various shapes in a plan view, e.g., a circle, an ellipse, a polygon, a polygon with rounded corners, etc. The first capacitors 420 may be arranged in a lattice pattern, such as a rectangular lattice pattern such as a square lattice pattern, or a honeycomb pattern in a plan view.

In the semiconductor device in accordance with some example embodiments, current may flow in the third direction D3, for example, in the vertical direction in the channel 335 between each of the first to fourth bit lines 272, 274, 276 and 278 and the upper contact plug 400, and thus the semiconductor device may include a vertical channel transistor (VCT) having a vertical channel.

As illustrated above, the first lower wiring 152 connected to the first transistor 502 included in the S/A circuit may be electrically connected to the first bit line 272 through a first conductive structure including the fifth lower contact plug 182, the fifth lower wiring 202 and the seventh lower contact plug 262 sequentially stacked in the third direction D3, and the third lower wiring 156 connected to the third transistor 506 included in the S/A circuit may be electrically connected to the third bit line 276 through a second conductive structure including the sixth lower contact plug 226, the sixth lower wiring 246 and the eighth lower contact plug 266 sequentially stacked in the third direction D3. The fifth lower wiring 202 included in the first conductive structure between the first lower wiring 152 and the first bit line 272 may be formed at a level different from a level at which the sixth lower wiring 246 included in the second conductive structure between the third lower wiring 156 and the third bit line 276.

Thus, when compared to a case in which the fifth and sixth lower wirings 202 and 246 are formed at the same level, a distance between the fifth lower wirings 202 at the same level and a distance between the sixth lower wiring 246 at the same level may be greater even if the fifth and sixth lower wirings 202 and 246 have larger widths. Accordingly, each of the fifth and sixth lower wirings 202 and 246 may have a reduced resistance, and/or the fifth and sixth lower wirings 202 and 246 may be more easily formed.

FIGS. 5 to 19 are plan views and cross-sectional views illustrating a method of manufacturing a semiconductor device in accordance with some example embodiments. Particularly, FIGS. 5, 7, 9, 11, 14, 16 and 18 are the plan views, and FIGS. 6, 8 and 10 are cross-sectional views taken along line A-A' of corresponding plan views, respectively, and FIGS. 12-13, 15, 17 and 19 are cross-sectional views taken along lines B-B' of corresponding plan views, respectively.

Figure 5:
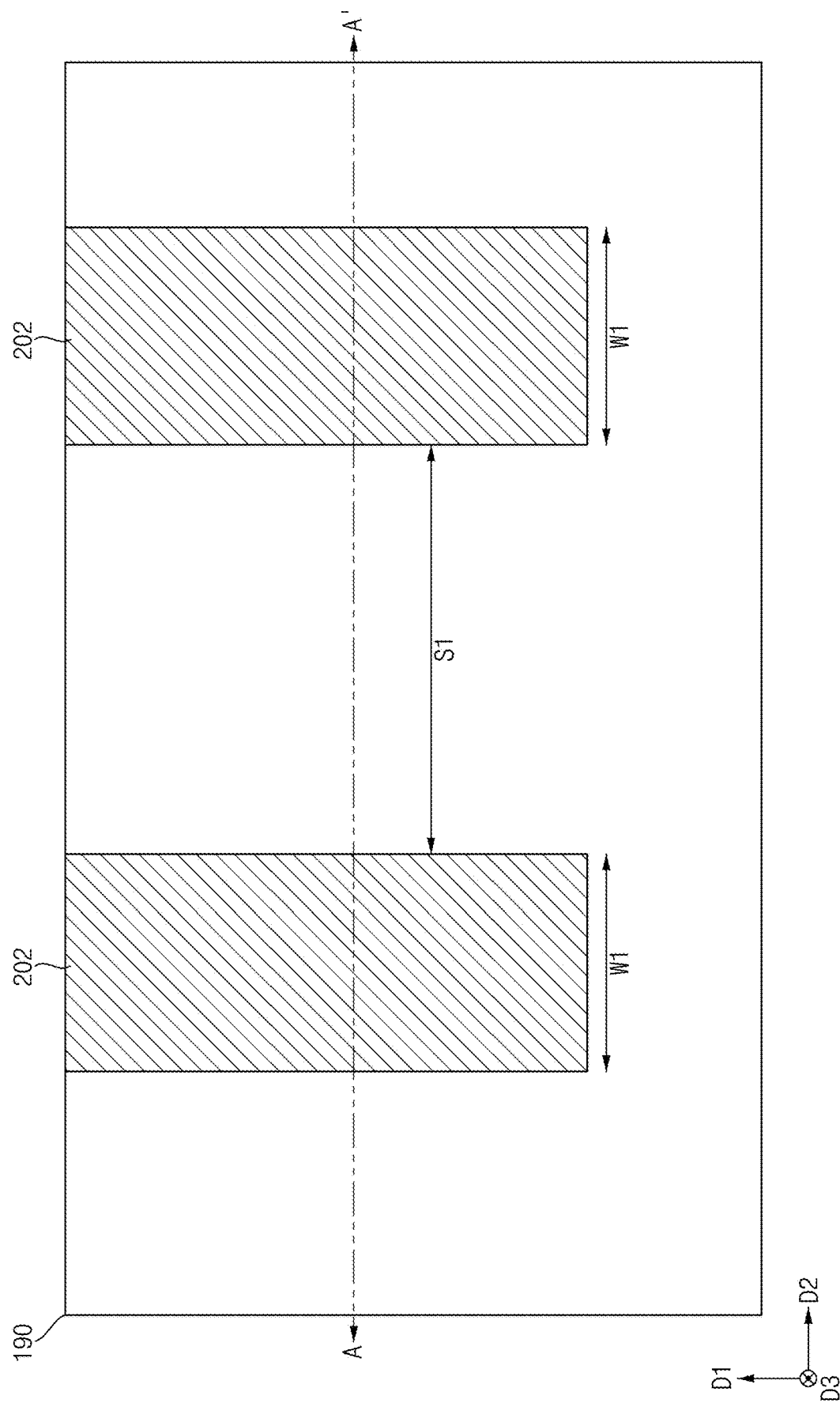
FIGS. 5 to 19 are plan views and cross-sectional views illustrating a method of manufacturing a semiconductor device in accordance with some example embodiments.
Figure 6:
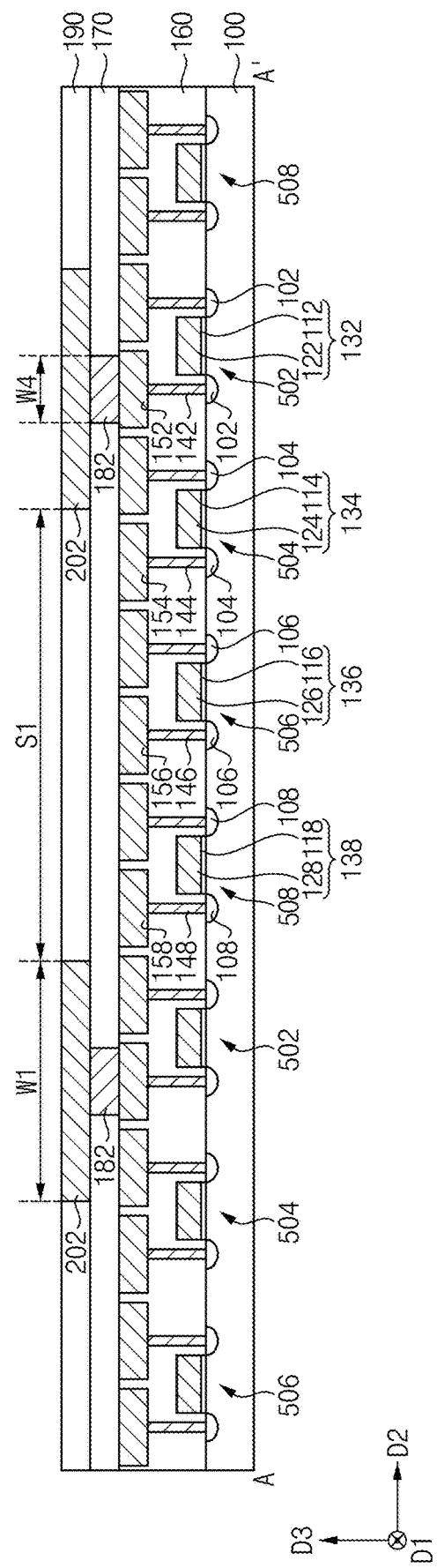

Referring to FIGS. 5 and 6, first to fourth transistors 502, 504, 506, and 508 may be formed on a substrate 100. Although four transistors 502, 504, 506, and 508 are illustrated, example embodiments are not limited thereto, and more or fewer transistors may be formed.

In various example embodiments, the first to fourth transistors 502, 504, 506, and 508 may be repeatedly formed in the second direction D2 in this order.

In various example embodiments, the first to fourth lower gate structures 132, 1.34, 136 and 138 included in the first to fourth transistors 502. 504, 506 and 508, respectively, may extend in the first direction D1.

First to fourth lower contact plugs 142, 144, 146 and 148 may be formed on upper surfaces of the first to fourth impurity regions 102, 104, 106 and 108, respectively, and first to fourth lower wirings 152, 154, 156 and 158 may be formed to contact upper surfaces of the first to fourth lower contact plugs 142, 144, 146 and 148, respectively. In various example embodiments, each of the first to fourth lower wirings 152, 154, 156 and 158 may extend in the first direction D1.

A first lower insulating interlayer 160 may be formed, e.g. deposited with a process such as a chemical vapor deposition (CVD) process such as a low-pressure CVD (LPCVD) and/or plasma-enhanced CVD (PECVD) process and/or an etch-back process and/or a chemical mechanical planarization (CMP) process, on the substrate 100 to cover the first to fourth transistors 502, 504, 506 and 508 and the first to fourth lower contact plugs 142, 144, 146 and 148 and surround sidewalls of the first to fourth lower wirings 152, 154, 156 and 158.

A second lower insulating interlayer 170 may be formed on the first lower insulating interlayer 160 and the first to fourth lower wirings 152, 154, 156 and 158, and a fifth lower contact plug 182 may be formed through the second lower insulating interlayer 170 to contact an upper surface of the first lower wiring 152. The second lower insulating layer 170 may be formed in the same manner as, or in a different manner from, that of the first lower insulating layer 160.

A third lower insulating interlayer 190 may be formed on the second lower insulating interlayer 170 and the fifth lower contact plug 182, and a fifth lower wiring 202 may be formed through the third lower insulating interlayer 190 to contact an upper surface of the fifth lower contact plug 182. The third lower insulating layer 190 may be formed in the same manner as, or in a different manner from, that of the second lower insulating layer 170.

In various example embodiments, each of the fifth lower wirings 202 may have a first width W1 in the second direction D2, and the fifth lower wirings 202 may be spaced apart from each other in the second direction D2 by a first distance S1.

Figure 7:
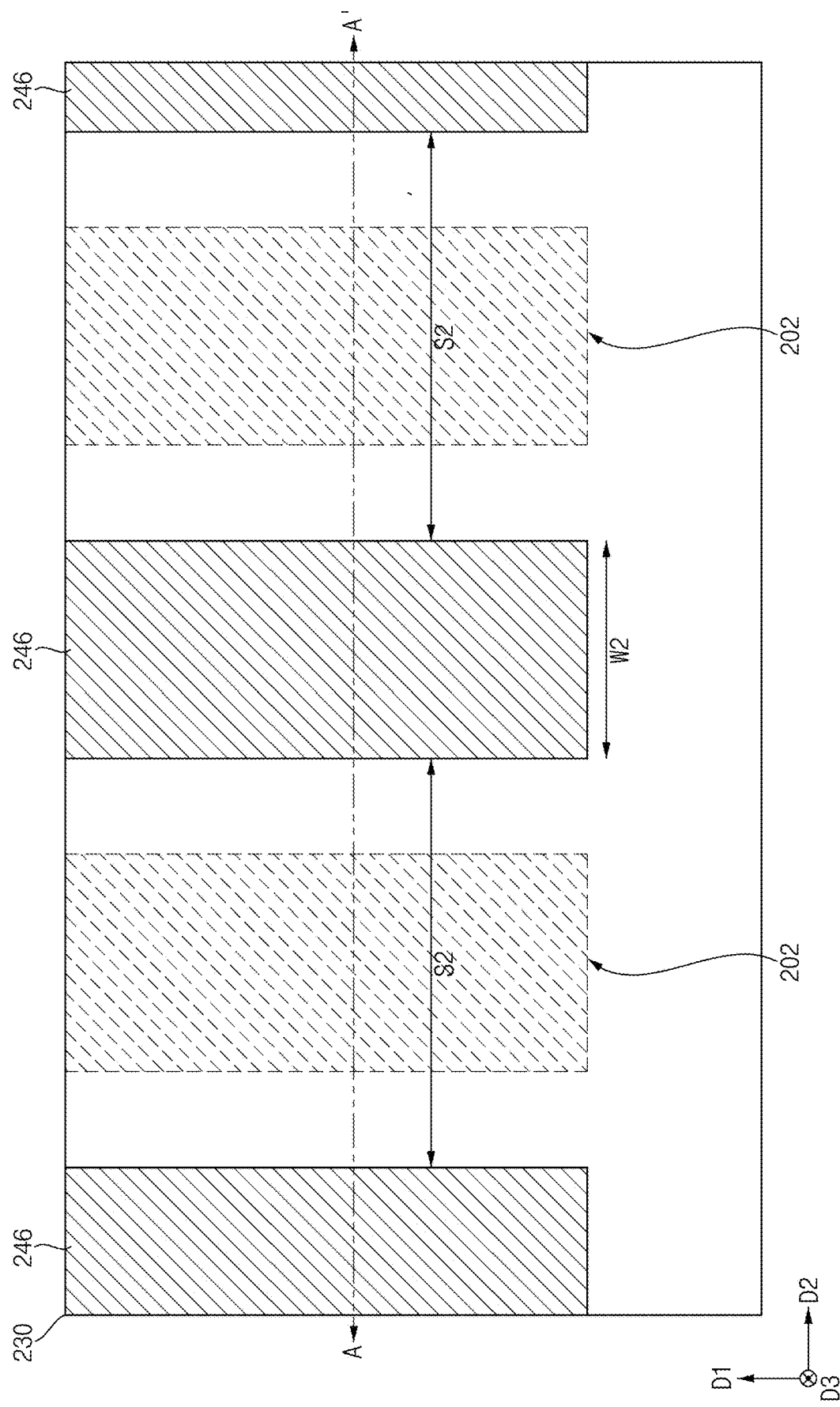
Figure 8:
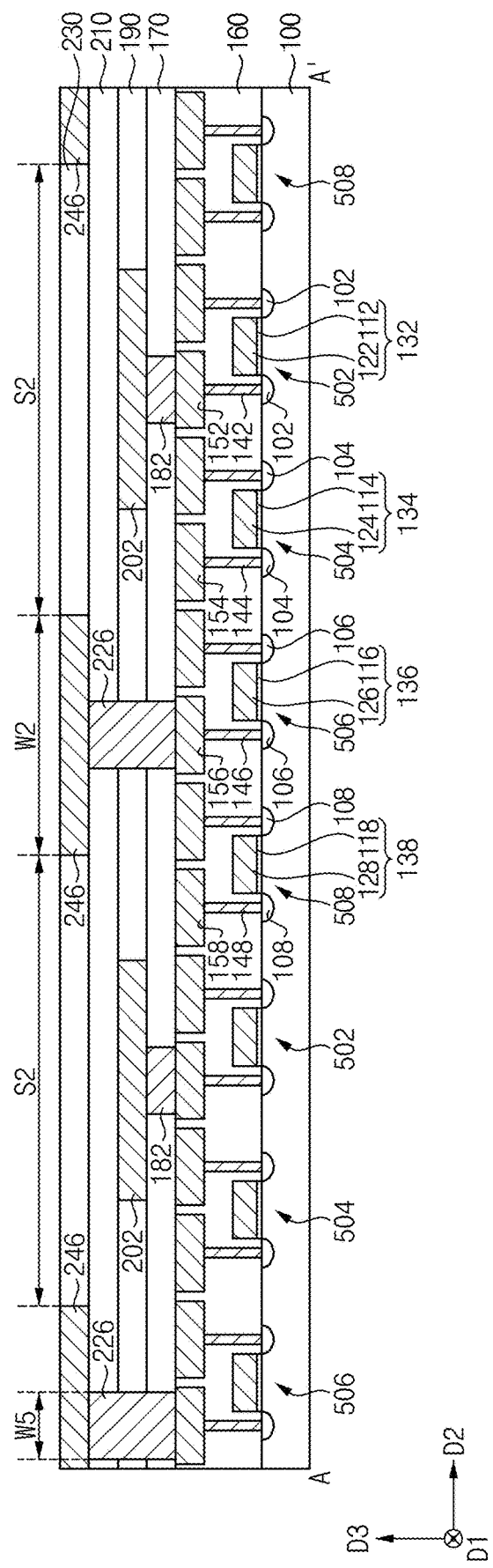

Referring to FIGS. 7 and 8, a fourth lower insulating interlayer 210 may be formed on the third lower insulating interlayer 190 and the fifth lower wiring 202, and a sixth lower contact plug 226 may be formed through the second to fourth insulating interlayers 170, 190 and 210 to contact an upper surface of the third lower wiring 156. The sixth lower contact plug 226 may have a fifth width W5 in the second direction D2.

A fifth lower insulating interlayer 230 may be formed on the fourth lower insulating interlayer 210 and the sixth lower contact plug 226, and a sixth lower wiring 246 may be formed through the fifth lower insulating interlayer 230 to contact an upper surface of the sixth lower contact plug 226.

In various example embodiments, each of the sixth lower wirings 246 may have a second width W2 in the second direction D2, and the sixth lower wirings 246 may be spaced apart from each other in the second direction D2 by a second distance S2. In various example embodiments, the sixth lower wiring 246 may not overlap the fifth lower wiring 202 in the third Referring to FIGS. 9 and 10, a sixth lower insulating interlayer 250 may be formed on the fifth lower insulating interlayer 230 and the sixth lower wiring 246, and a seventh lower contact plug 266 extending through the fourth to sixth insulating interlayers 210, 230 and 250 to contact an upper surface of the fifth lower wiring 202 and an eighth lower contact plug extending through the sixth insulating interlayer 250 to contact an upper surface of the sixth lower wiring 246 may be formed. The seventh and eighth contact plugs 262 and 266 may have sixth and seventh widths W6 and W7, respectively.

First to fourth bit line structures 292, 294, 296 and 298 may be formed on the sixth insulating interlayer 250 and the seventh and eighth lower contact plugs 262 and 266, and a first opening exposing upper surfaces of the sixth insulating interlayer 250 and the seventh and eighth lower contact plugs 262 and 266 may be formed between neighboring ones of the first to fourth bit line structures 292, 294, 296 and 298.

The first bit line structure 292 may include a first bit line 272 and a first insulation pattern 282 stacked in the third direction D3, the second bit line structure 294 may include a second bit line 274 and a second insulation pattern 284 stacked in the third direction D3, the third bit line structure 296 may include a third bit line 276 and a third insulation pattern 286 stacked in the third direction D3, and the fourth bit line structure 298 may include a fourth bit line 278 and a fourth insulation pattern 288 stacked in the third direction D3.

In various example embodiments, each of the first to fourth bit line structures 292, 294, 296 and 298 may extend in the first direction D1. Each of the first to fourth bit line structures 292, 294, 296 and 298 may have a third width W3 in the second direction D2, and the first to fourth bit line structures 292, 294, 296 and 298 may be spaced apart from each other in the second direction D2 by a third distance S3. In various example embodiments the third width W3 may be greater than each of, or at least one of, the fourth to seventh widths W4, W5, W6 and W7.

A first upper insulating interlayer may be formed on the first to fourth bit line structures 292, 294, 296, and 298 and the seventh and eighth lower contact plugs 262 and 266 to fill the first opening, and the first upper insulating interlayer may be planarized until upper surfaces of the first to fourth bit line structures 292, 294, 296 and 298 are exposed to form a first upper insulating interlayer pattern 300 extending in the first direction D1 between neighboring ones of the first to fourth bit line structures 292, 294, 296 and 298.

The first upper insulating interlayer pattern 300 may also cover end portions in the first direction D1 of the first to fourth bit line structures 292, 294, 296 and 298.

In various example embodiments, the planarization process may include a chemical mechanical polishing (CMP) process and/or an etch back process.

Figure 11:
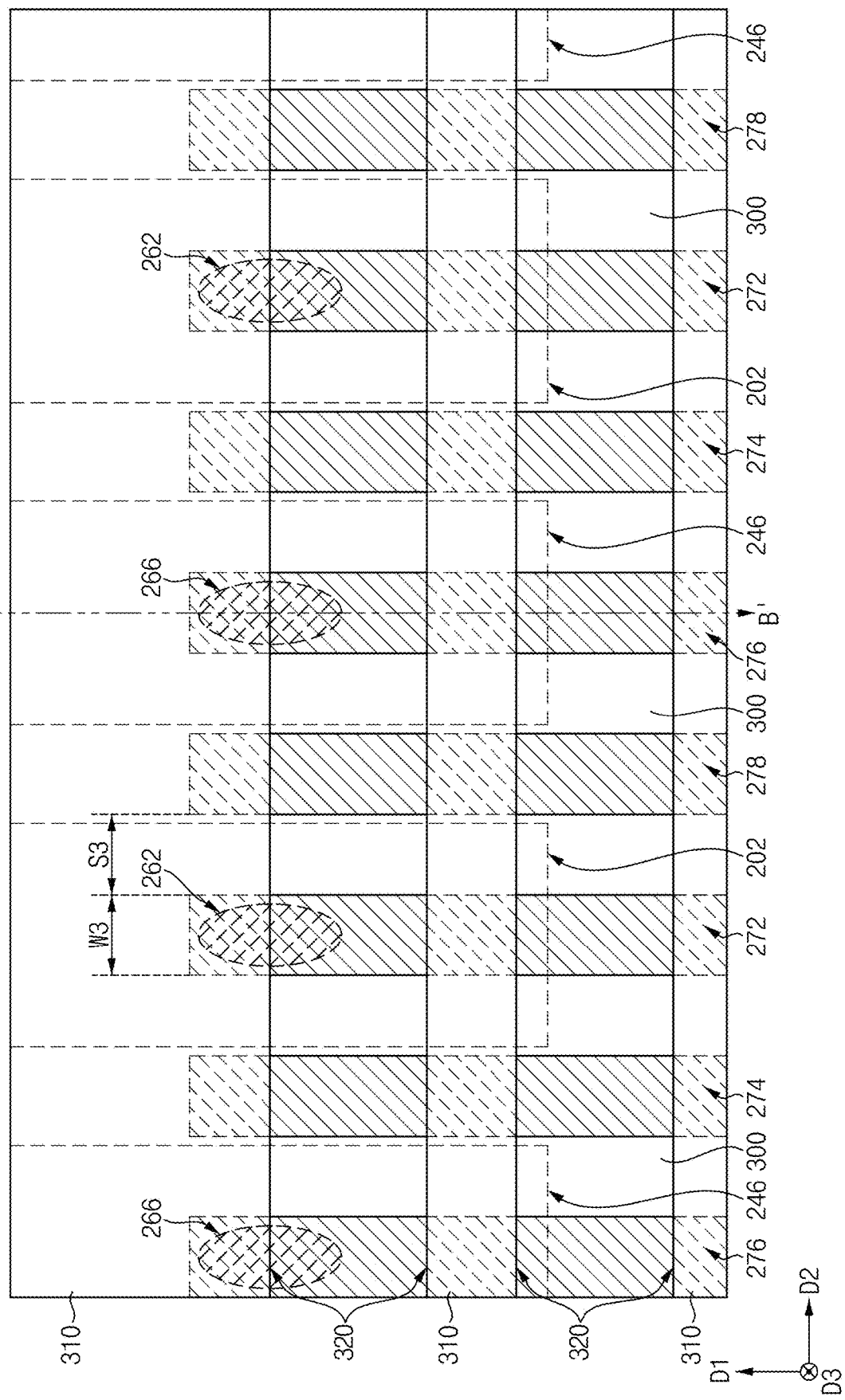
Figure 12:
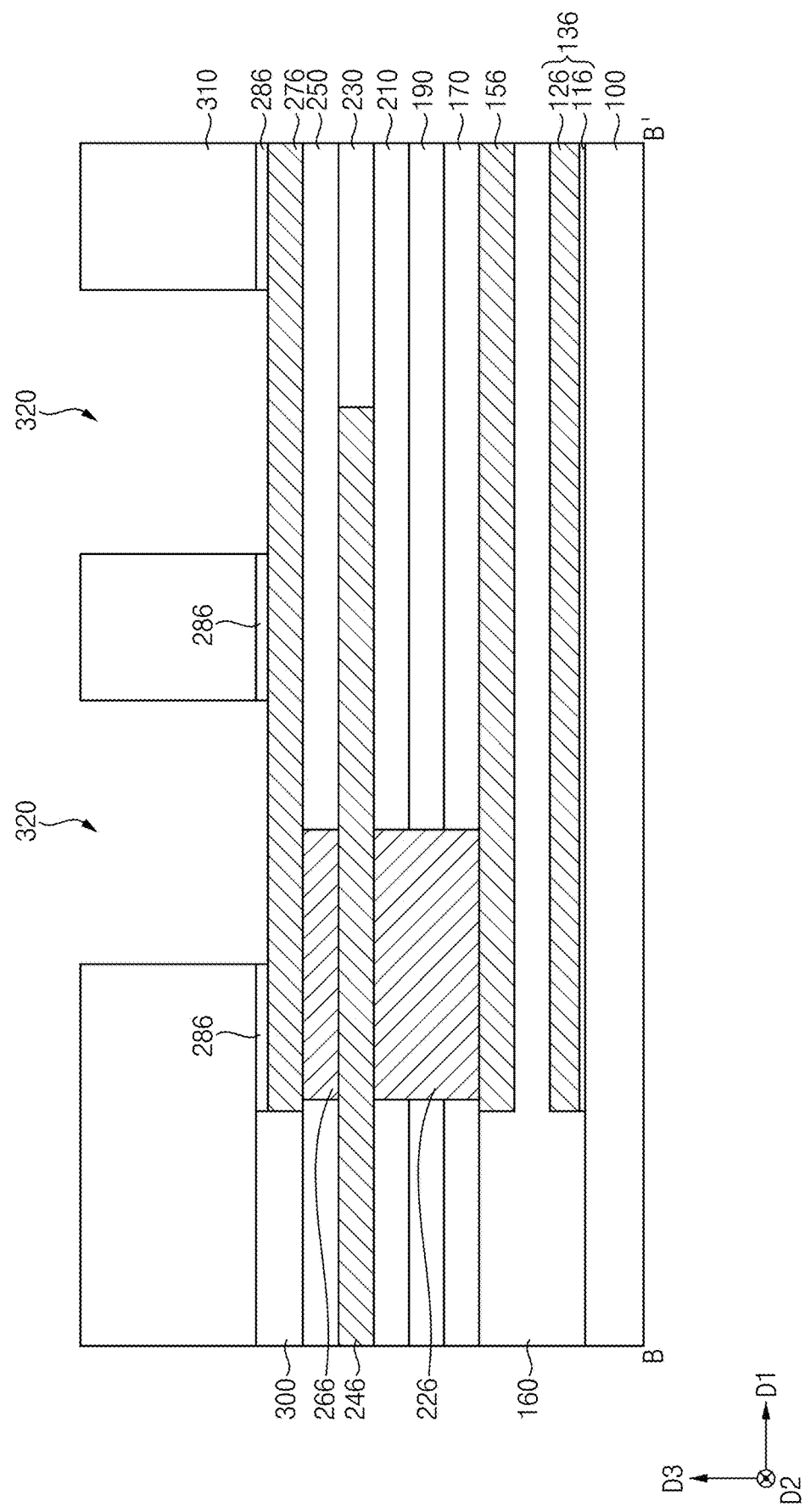

Referring to FIGS. 11 and 12, a second upper insulating interlayer may be formed on the first to fourth bit line structures 292, 294, 296 and 298 and the first upper insulating interlayer pattern 300, and the second upper insulating interlayer and the first to fourth insulation patterns 282, 284, 286 and 288 may be partially etched by, e.g., a dry etching process to form a second opening 320 exposing upper surfaces of the first to fourth bit lines 272, 274, 276 and 278 and the first upper insulating interlayer pattern 300 and extending in the second direction D2.

Thus, the second upper insulating interlayer may be divided into a plurality of second upper insulating interlayer patterns 310 spaced apart from each other in the first direction D1, and each of the second upper insulating interlayer patterns 310 may extend in the second direction D2.

Figure 13:
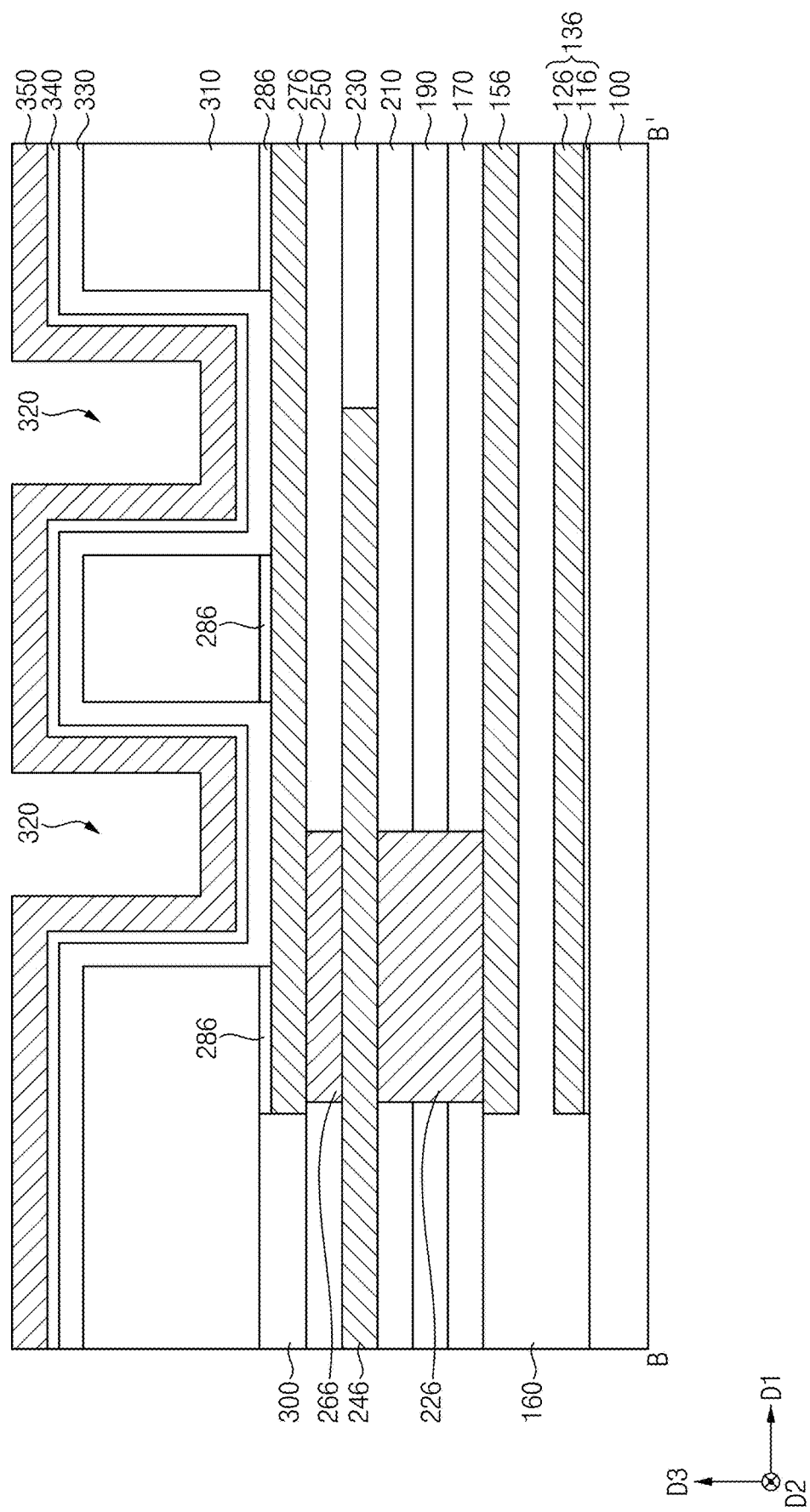

Referring to FIG. 13, a channel layer 330, an upper gate insulation layer 340 and an upper gate electrode layer 350 may be formed, e.g. deposited and/or grown, and may be sequentially stacked on the upper surfaces of the first to fourth bit lines 272, 274, 276, and 278 and the first upper insulating interlayer pattern 300 exposed by the second opening 320 and a sidewall and an upper surface of the second upper insulating interlayer pattern 310.

In various example embodiments, the channel layer 330, the upper gate insulation layer 340 and the upper gate electrode layer 350 may be formed by a deposition process, e.g., one or more of an atomic layer deposition (ALD) process, a chemical vapor deposition (CVD) process, etc.

In various example embodiments, the channel layer 330 may include an amorphous oxide semiconductor material, e.g., IGZO at a relatively low temperature, while the upper gate insulation layer 340 and the upper gate electrode layer 350 may be formed at a relatively high temperature.

Figure 14:
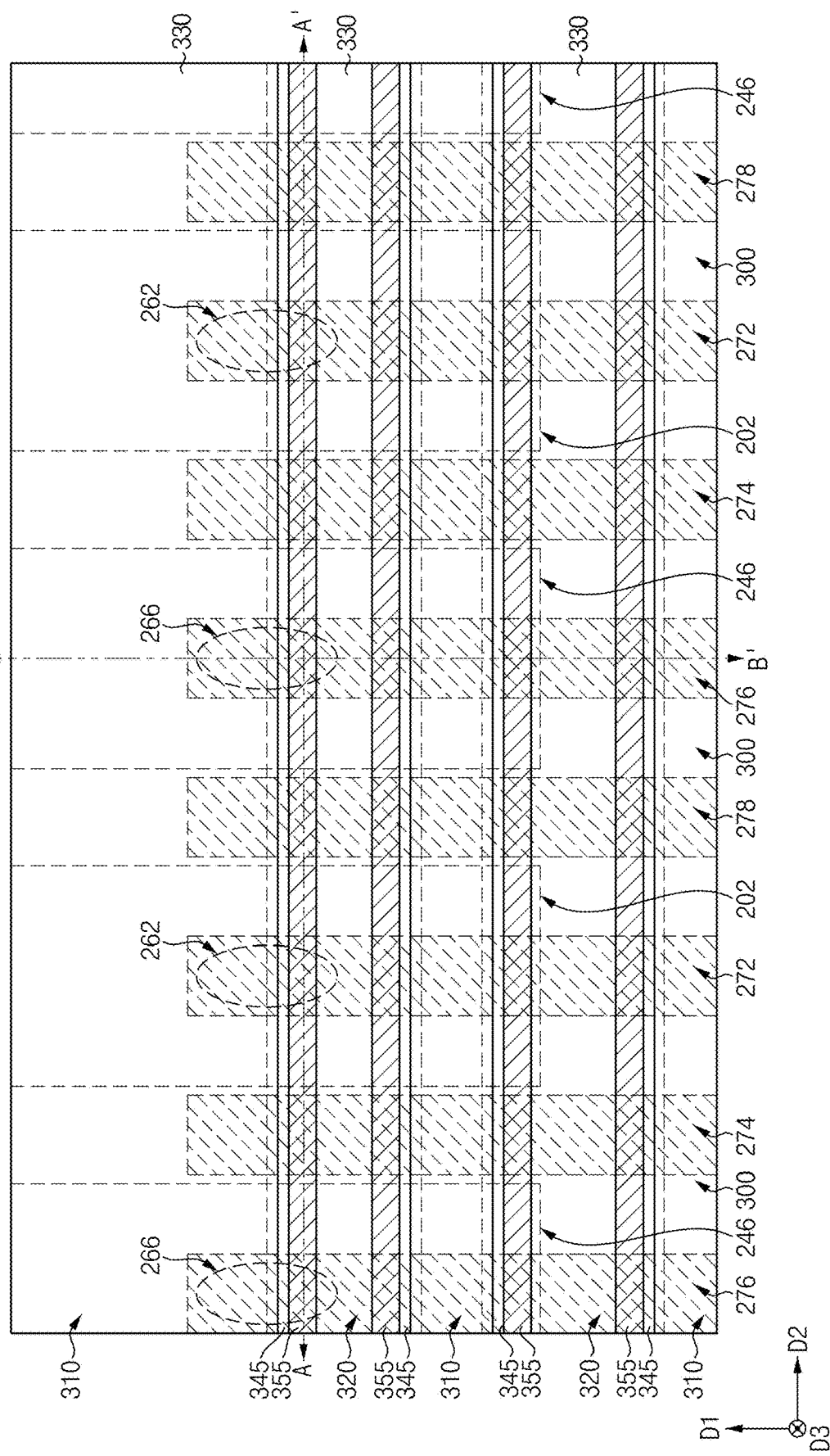
Figure 15:
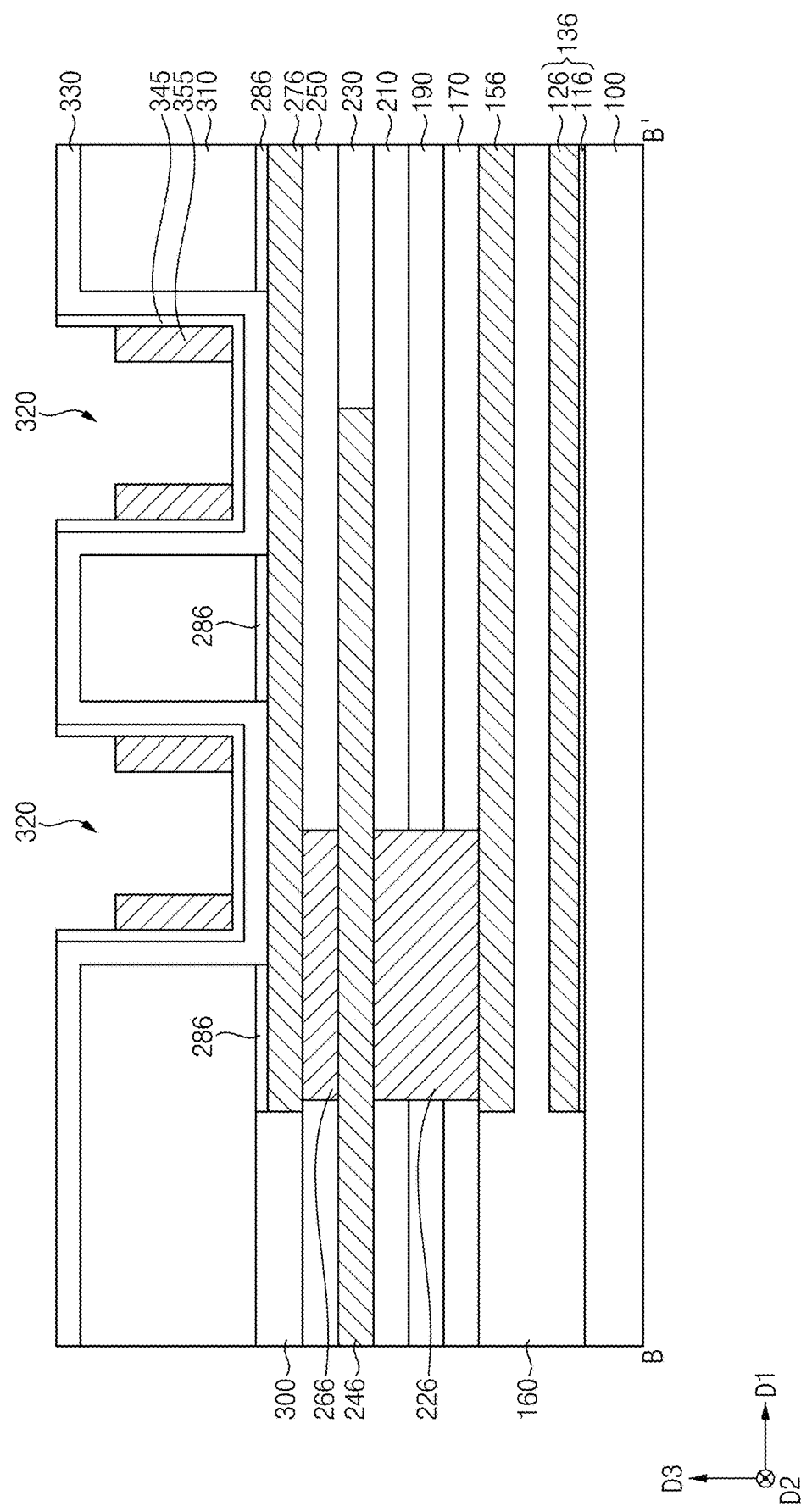

Referring to FIGS. 14 and 15, the upper gate electrode layer 350 and the upper gate insulation layer 340 may be anisotropically etched to form an upper gate electrode 355 and an upper gate insulation pattern 345, respectively, in the second opening 320.

An outer sidewall of the upper gate insulation pattern 345 may contact an inner sidewall of a portion of the channel layer 330 on a sidewall of the second upper insulating interlayer pattern 310, and a lower surface of the upper gate insulation pattern 345 may contact an upper surface of a portion of the channel layer 330 on the upper surfaces of the first to fourth bit lines 272, 274, 276, and 278 and the first upper insulating interlayer pattern 300. In various example embodiments, a cross-section of the upper gate insulation pattern 345 in the first direction D1 may have a cup shape. Alternatively or additionally, a cross-section of the upper gate insulation pattern 345 in the first direction D1 may have an "L" shape.

The upper gate electrode 355 may contact an inner sidewall of the upper gate insulation pattern 225 and an upper surface of a portion of the upper gate insulation pattern 225 on the upper surface of the channel layer 330 on the upper surfaces of the first to fourth bit lines 272, 274, 276 and 278 and the first upper insulating interlayer pattern 300.

An upper portion of the upper gate electrode 355 may be removed by, e.g., an etch back process. Thus, an upper surface of the upper gate electrode 355 may be lower than an upper surface of the upper gate insulation pattern 345, and an upper inner sidewall of the upper gate insulation pattern 345 may be exposed. In various example embodiments, the upper surface of the upper gate electrode 355 may be lower than (below) an upper surface of the second upper insulating interlayer pattern 310.

Figure 16:
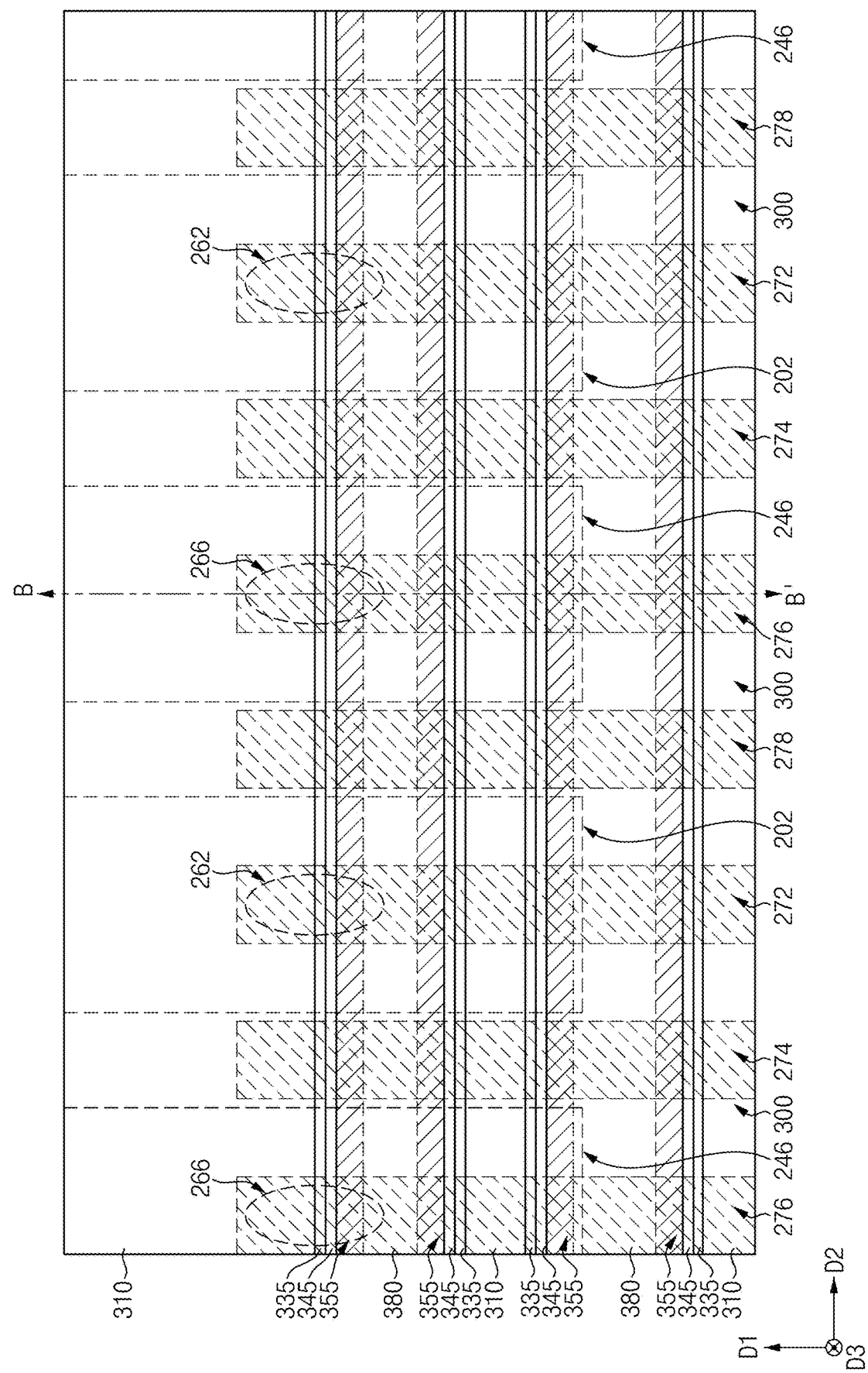
Figure 17:
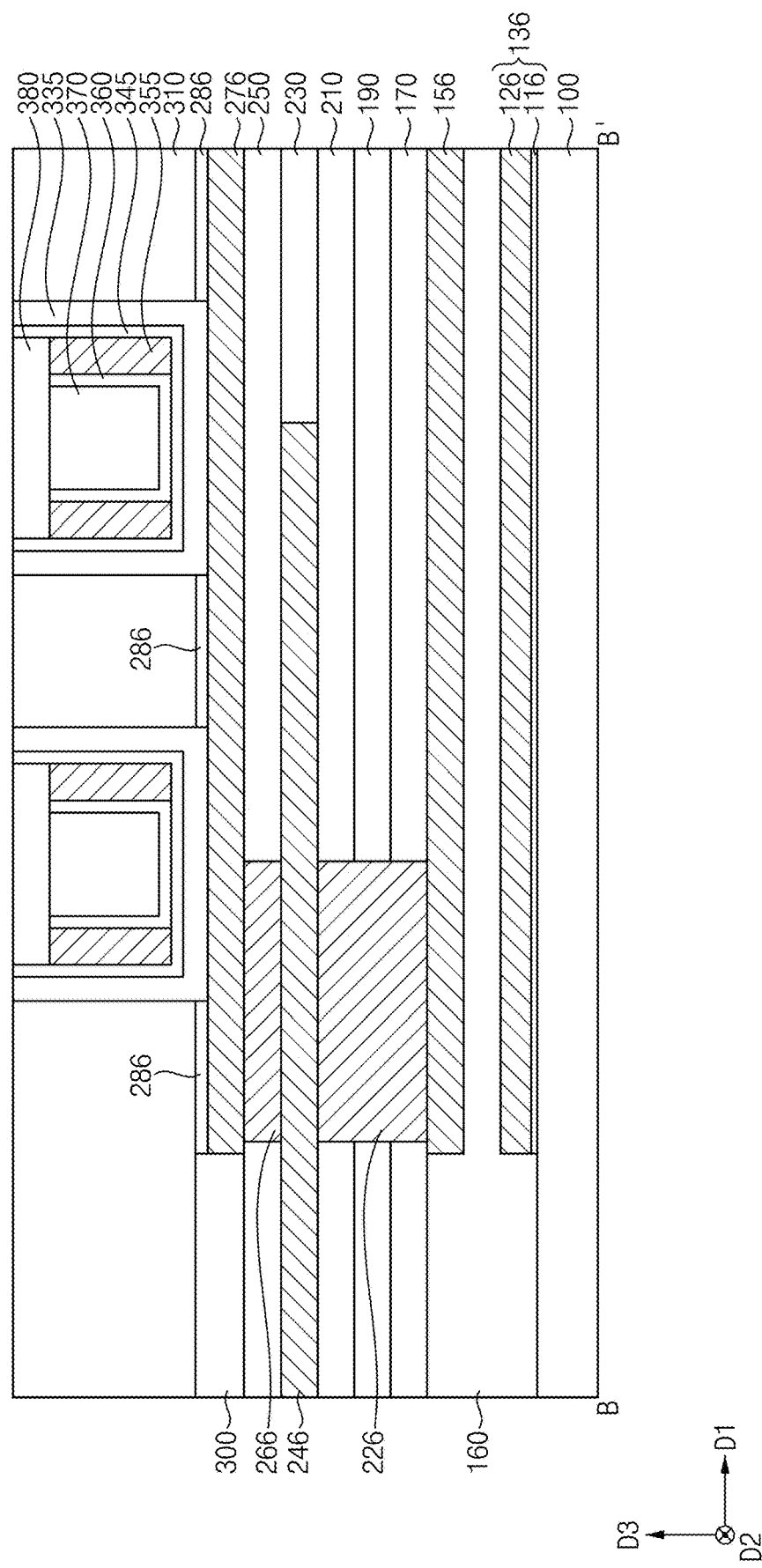

Referring to FIGS. 16 and 17, a fifth insulation layer may be formed on a sidewall and the upper surface of the upper gate electrode 355, the upper inner sidewall and the upper surface of the upper gate insulation pattern 345, and an upper surface of the channel layer 330, a third insulating interlayer may be formed on the fifth insulation layer to fill a remaining portion of the second opening 320, and a planarization process may be performed on the third insulating interlayer, the fifth insulation layer, the upper gate insulation pattern 345 and the channel layer 330 until the upper surface of the second upper insulating interlayer pattern 310 is exposed.

The planarization process may include a CMP process and/or an etch back process.

By the planarization process, a third upper insulating interlayer pattern 370 and a fifth insulation pattern 360 covering a lower surface and a sidewall of the third upper insulating interlayer pattern 370 may be formed in the second opening 320, and the channel layer 330 may be divided into a plurality of channels 335 spaced apart from each other in the first direction D1. In various example embodiments, each of the channels 335 may extend in the second direction D2, and a cross-section in the first direction D1 of each of the channels 335 may have a cup shape.

Upper portions of the third upper insulating interlayer pattern 370 and the fifth insulation pattern 360 may be removed to form a first recess exposing the upper surface of the upper gate electrode 355, and a sixth insulation pattern 380 may be formed in the first recess.

The sixth insulation pattern 380 may be formed by forming a sixth insulation layer on the upper gate electrode 355, the third upper insulating interlayer pattern 370, the upper gate insulation pattern 345, the channel 335 and the second upper insulating interlayer pattern 310 to fill the first recess, and planarizing the sixth insulation layer until the upper surface of the second upper insulating interlayer pattern 310 is exposed.

Each of the channels 335 may be partially removed, e.g. partially etched, to form a third opening exposing the upper surfaces of the first to fourth bit lines 272, 274, 276 and 278 and the first upper insulating interlayer pattern 300, and an eleventh insulation pattern 500 may be formed in the third opening. Thus, the channel 335 extending in the second direction D2 may be divided into a plurality of channels 335 spaced apart from each other in the second direction D2. Accordingly, a plurality of channels 335 may be spaced apart from each other in each of the first and second directions D1 and D2.

Figure 18:
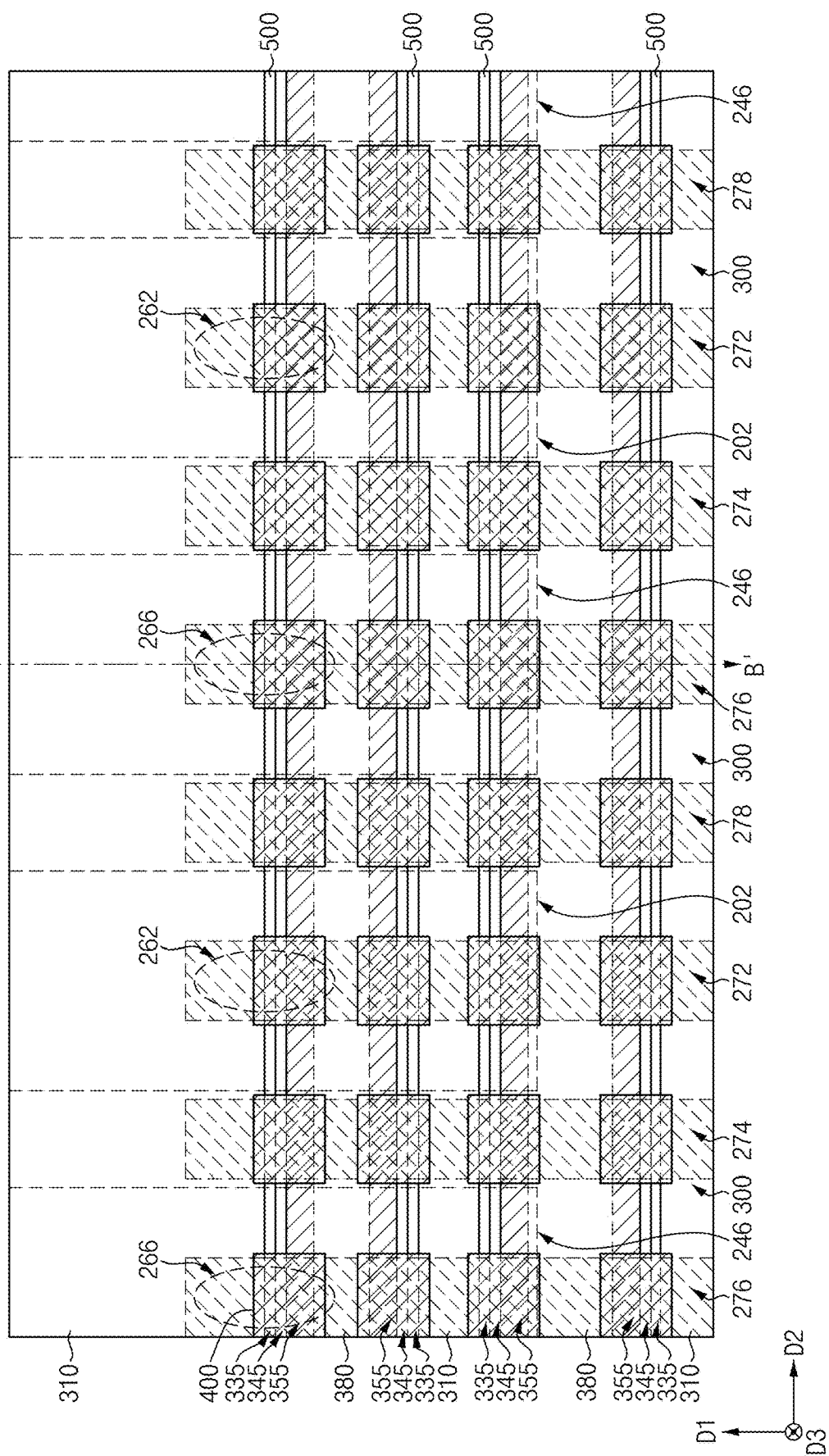
Figure 19:
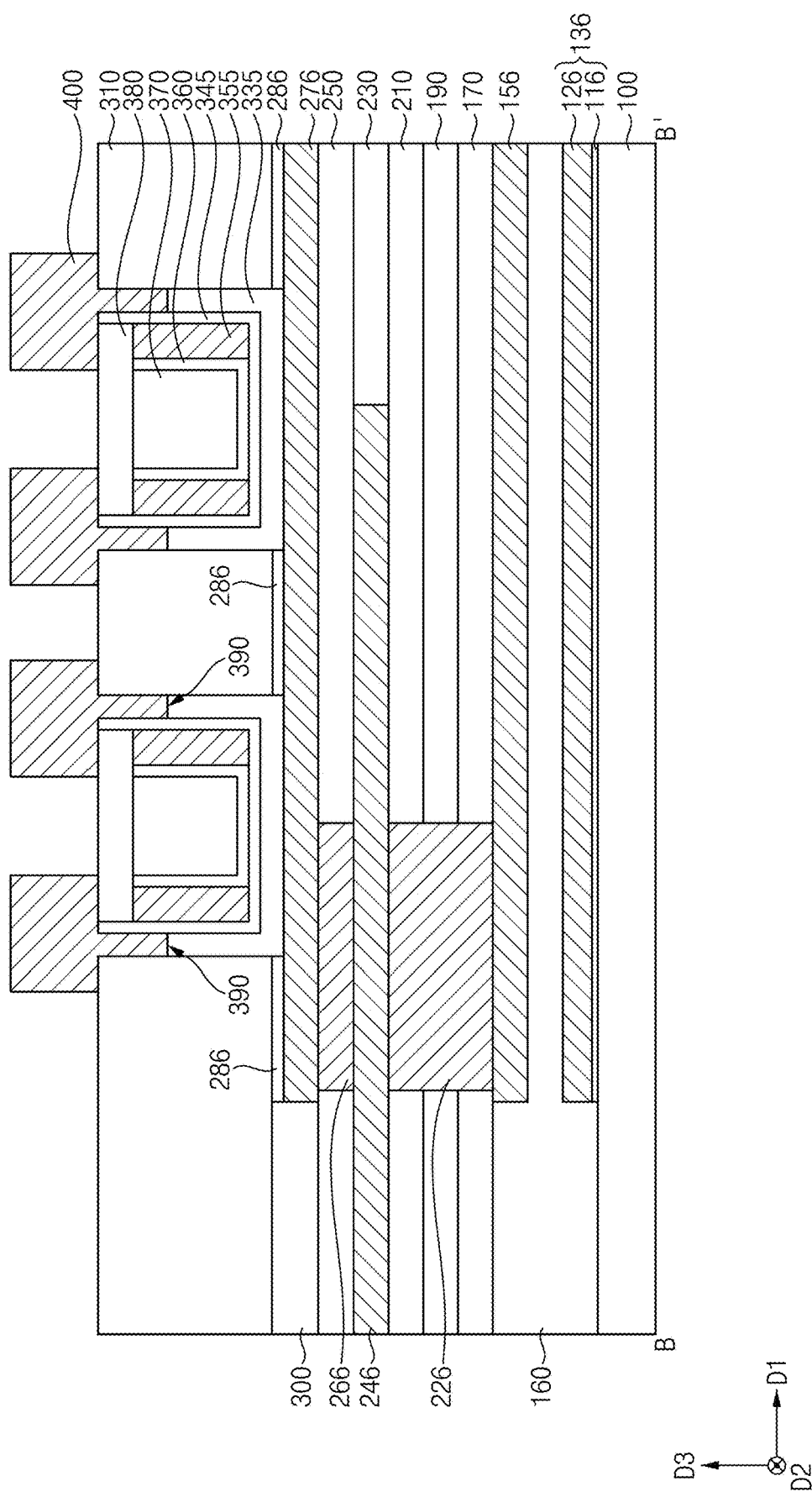

Referring to FIGS. 18 and 19, an upper portion of the channel 335 may be removed to form a second recess 390, and an upper contact plug 400 may be formed on the channel 335, the upper gate insulation pattern 345, the sixth insulation pattern 380 and the second upper insulating interlayer pattern 310 to fill the second recess 390.

In various example embodiments, a plurality of contact plugs 400 may be spaced apart from each other in the first and second directions D1 and D2.

In various example embodiments, the contact plugs 400 may be arranged in a lattice pattern. Alternatively or additionally, the contact plugs 400 may be arranged in a honeycomb pattern.

Referring to FIGS. 1 to 4, a fourth insulating interlayer may be formed on the second upper insulating interlayer pattern 310, the channel 335, the upper gate insulation pattern 345 and the sixth insulation pattern 380 to cover the contact plug 400, and may be planarized until an upper surface of the contact plug 400 is exposed. Thus, a fourth upper insulating interlayer pattern 410 may be formed to cover a sidewall of the contact plug 400.

A first capacitor electrode 420 may be formed to contact an upper surface of the upper contact plug 400, a dielectric layer 430 may be formed on an upper surface and a sidewall of the first capacitor electrode 420 and an upper surface of the fourth upper insulating interlayer pattern 410, and a second capacitor electrode 440 may be formed on the dielectric layer 430 to form a capacitor 450.

Thus, the semiconductor device may be manufactured or fabricated.

As illustrated above, the fifth and sixth lower wirings 202 and 246 may not be formed at the same level, but may be formed at different levels. Thus, even if the fifth and sixth lower wirings 202 and 246 have relatively large widths, the distance between the fifth lower wirings 202 and distance between the sixth lower wirings 246 are large so that the fifth and sixth lower wirings 202 and 246 may be easily formed.

Figure 9:
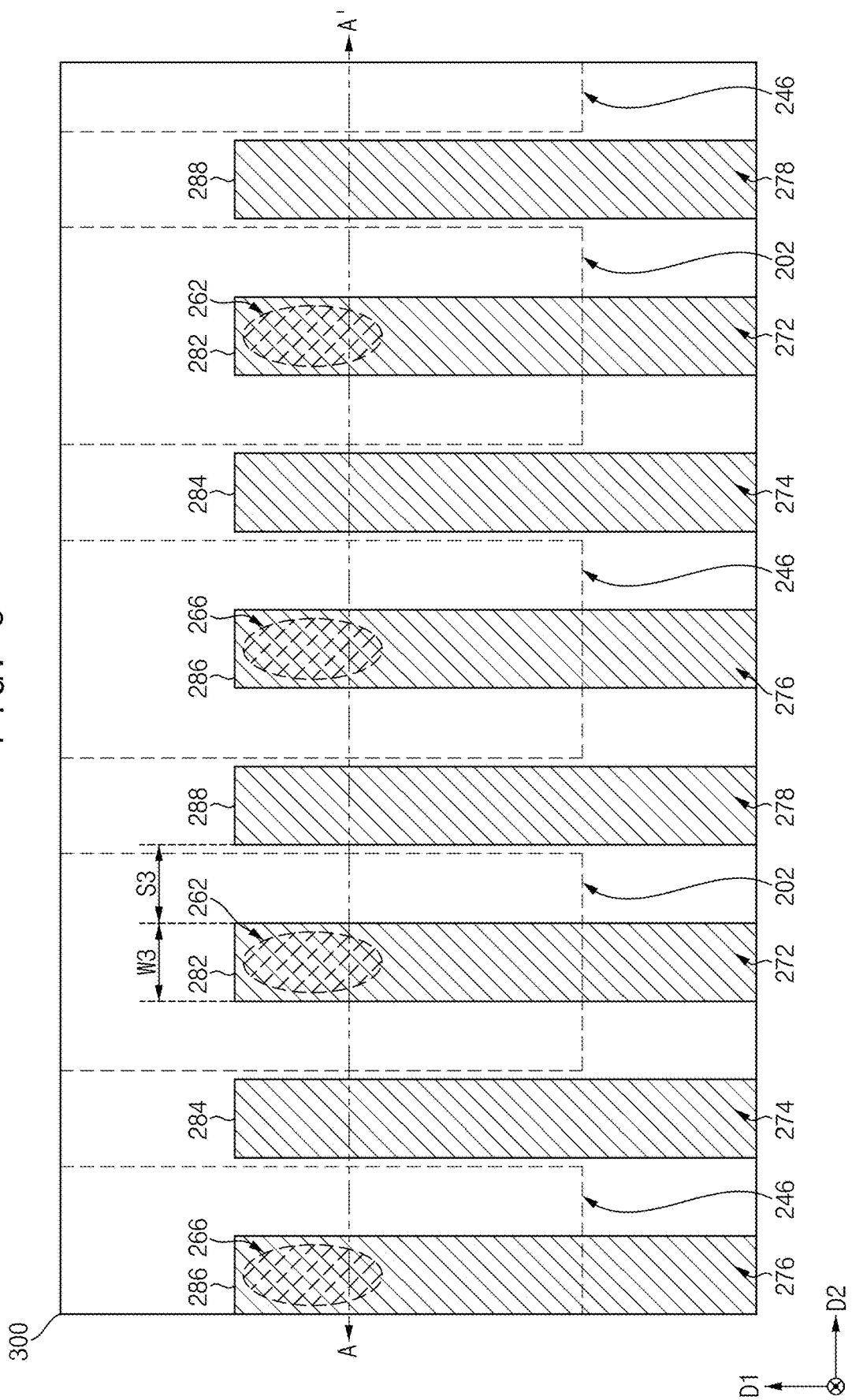
Figure 20:
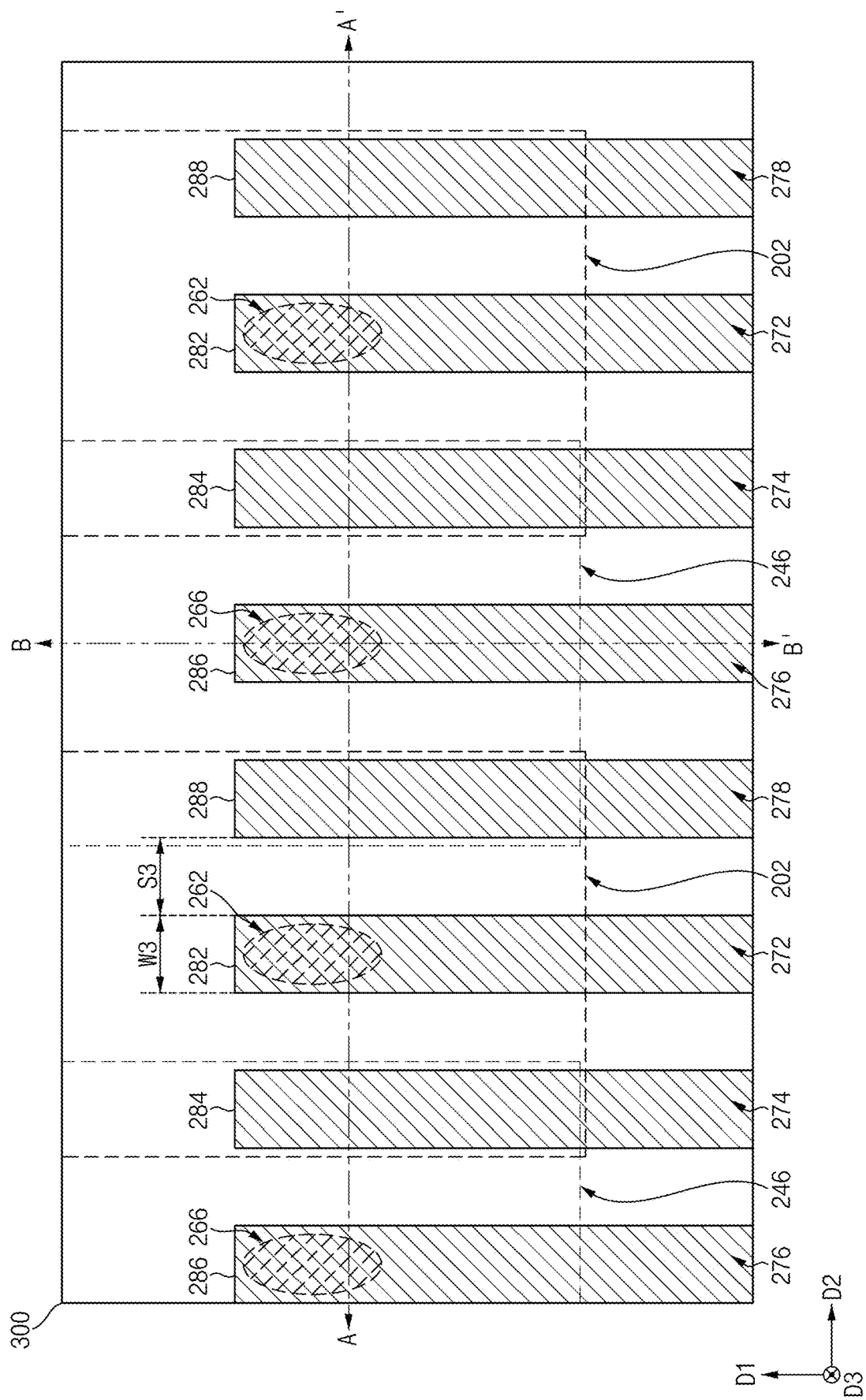
FIGS. 20 and 21 are a plan view and a cross-sectional view, respectively, illustrating a semiconductor device in accordance with some example embodiments.
Figure 21:
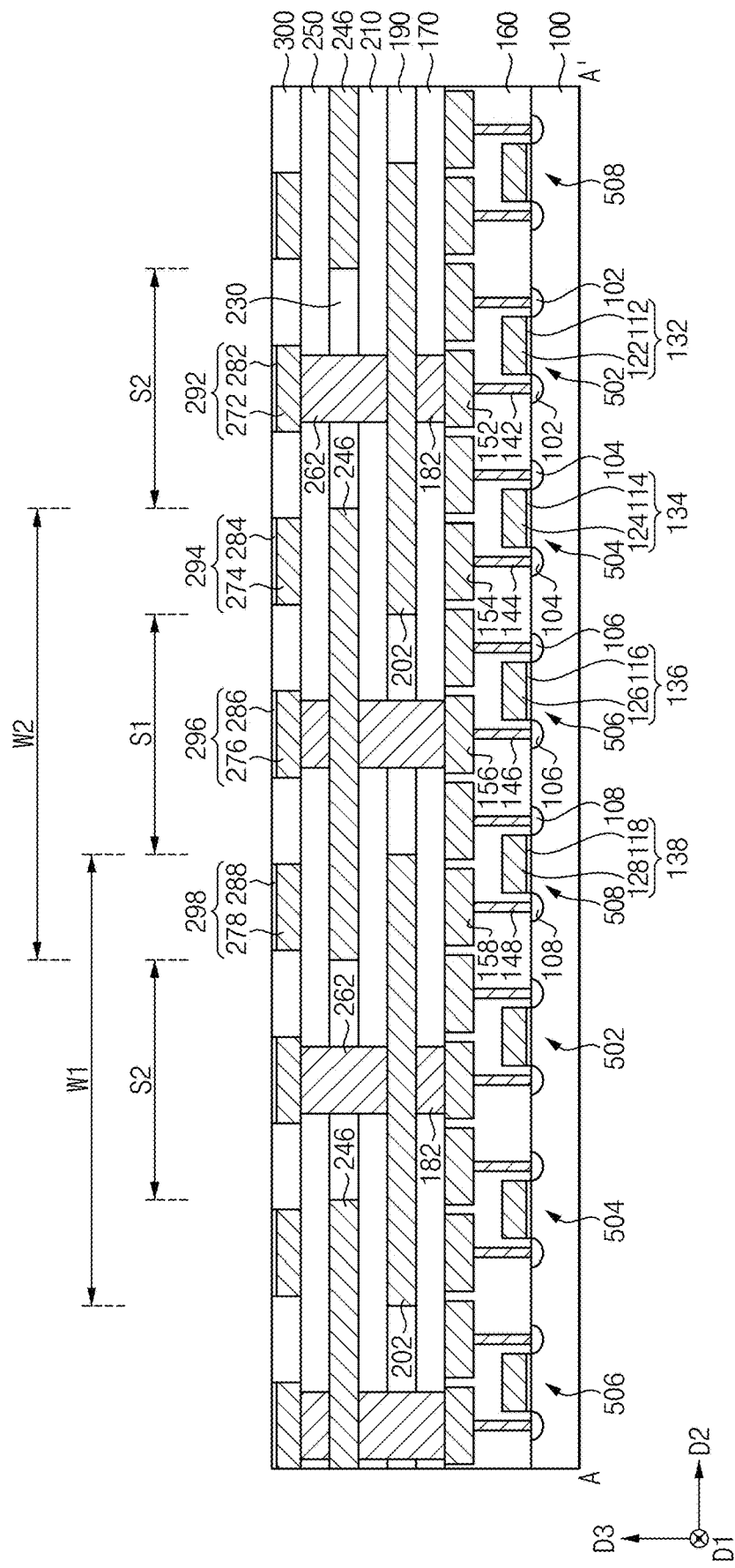

FIGS. 20 and 21 are a plan view and a cross-sectional view, respectively, illustrating a semiconductor device in accordance with some example embodiments, which may correspond to FIGS. 9 and 10, respectively. This semiconductor device may be substantially the same as or similar to that of FIGS. 1 to 4, except for the widths of the fifth and sixth lower wirings, and thus repeated explanations are omitted herein.

Referring to FIGS. 20 and 21, the first and second widths W1 and W2 in the second direction D2 of the fifth and sixth lower wirings 202 and 246 may be greater than the first and second widths W1 and W2 in the second direction D2 of the fifth and sixth lower wirings 202 and 246 shown in FIGS. 1 to 4.

Thus, the sixth lower wiring 246 may partially overlap the fifth lower wiring 202 in the third direction D3.

For example, the fifth and sixth lower wirings 202 and 246 may not be formed at the same level, but may be formed at different levels from each other, so that the first and second widths W1 and W2 may have relatively large values. Even if the fifth and sixth lower wirings 202 and 246 partially overlap each other in the third direction D3, the first distance S1 between the fifth lower wirings 202 and the second distance S2 between the sixth lower wirings 246 may have sufficiently large values.

Figure 22:
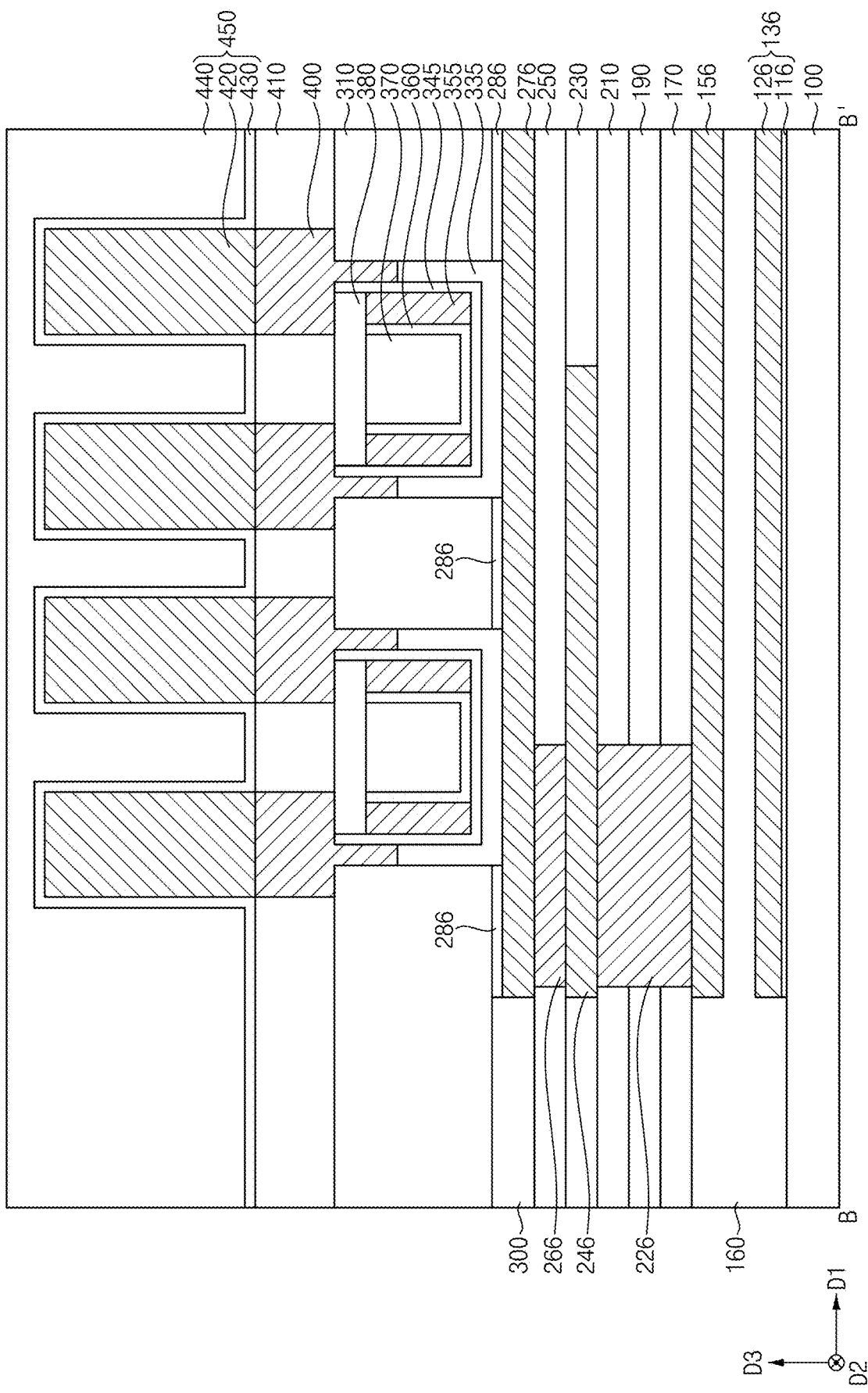
FIGS. 22 and 23 are cross-sectional views illustrating a semiconductor device in accordance with some example embodiments.
Figure 23:
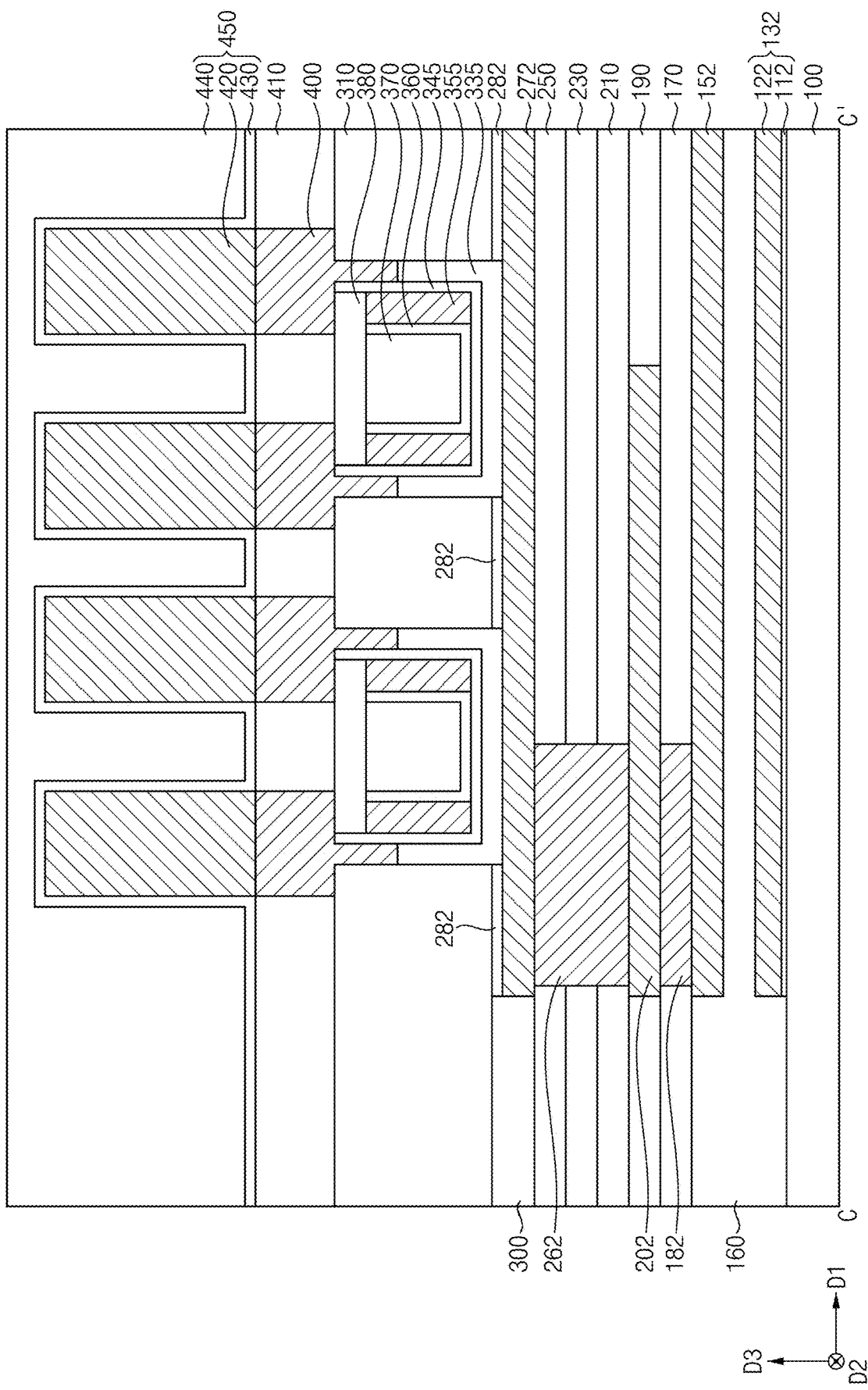

FIGS. 22 and 23 are cross-sectional views illustrating a semiconductor device in accordance with some example embodiments, which may correspond to FIGS. 3 and 4, respectively. This semiconductor device may be substantially the same as or similar to that of FIGS. 1 to 4, except for an area of the fifth and sixth lower wirings, and thus repeated explanations are omitted herein.

Referring to FIGS. 22 and 23, the fifth and sixth lower wirings 202 and 246 may not be formed at outsides in the first direction D1 of the first end portions in the first direction D1 of the first to fourth bit lines 272, 274, 276, and 278, in a plan view.

That is, each of the fifth and sixth lower wirings 202 and 246 may be formed in an area where the first to fourth bit lines 272, 274, 276 and 278 are formed and a space between the first to fourth bit lines 272, 274, 276 and 278, in a plan view.

Figure 24:
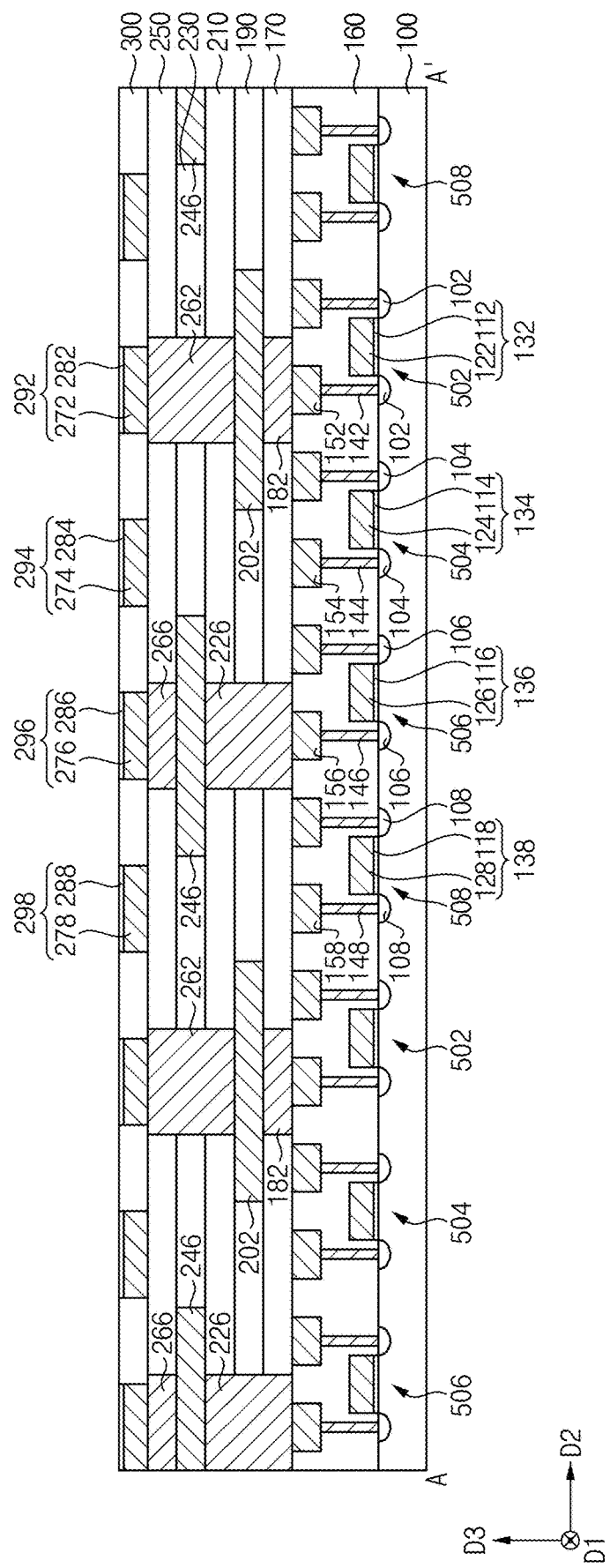
FIG. 24 is a cross-sectional view illustrating a semiconductor device in accordance with some example embodiments.

FIG. 24 is a cross-sectional view illustrating a semiconductor device in accordance with some example embodiments, which may correspond to FIG. 10. This semiconductor device may be substantially the same as or similar to that of FIGS. 1 to 4, except for the widths of the fifth to eighth lower contact plugs, and thus repeated explanations are omitted herein.

Referring to FIG. 24, the fourth to seventh widths W4, W5, W6 and W7 of the fifth to eighth lower contact plugs 182, 226, 262 and 266, respectively, may be greater than the third width W3 of the first to fourth bit lines 272, 274, 276 and 278.

The fourth to seventh widths W4, W5, W6 and W7 may be equal to or different from each other.

Figure 25:
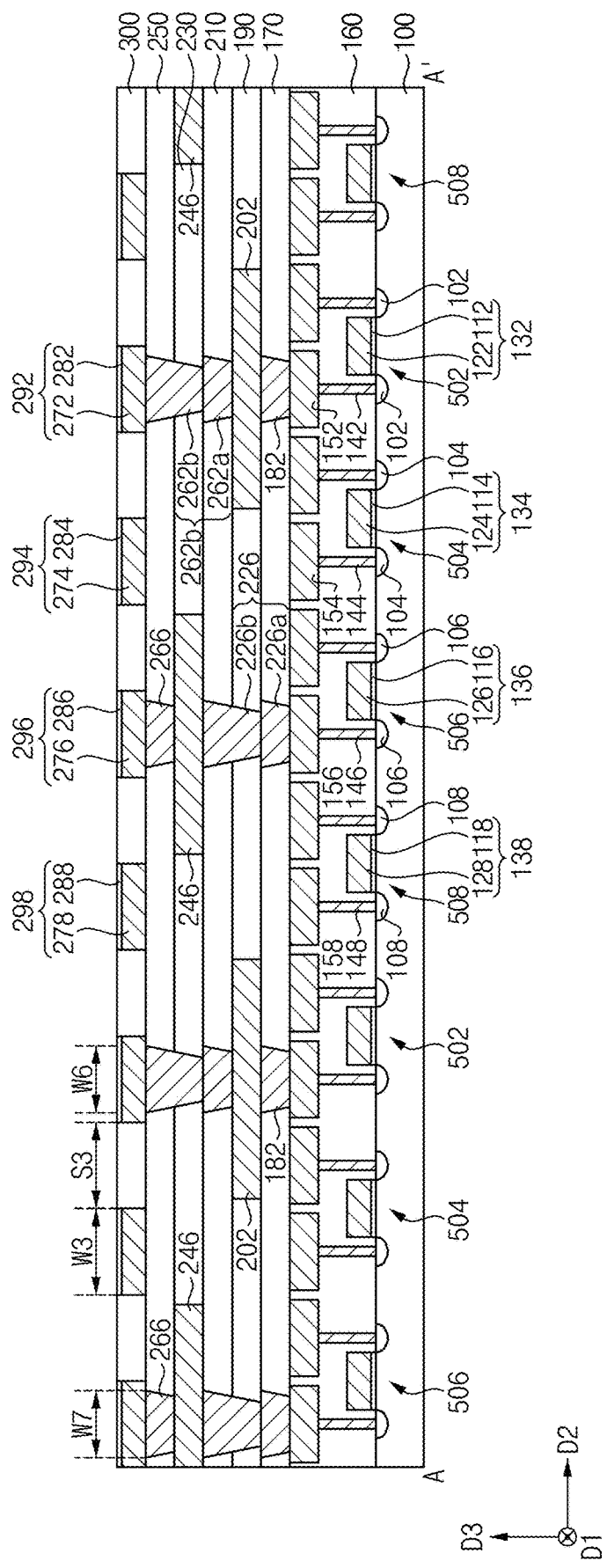
FIG. 25 is a cross-sectional views illustrating a semiconductor device in accordance with some example embodiments.

FIG. 25 is a cross-sectional views illustrating a semiconductor device in accordance with some example embodiments, which may correspond to FIG. 10. This semiconductor device may be substantially the same as or similar to that of FIGS. 1 to 4, except for the shape and structure of the sixth and seventh lower wirings, and thus repeated explanations are omitted herein.

Referring to FIG. 25, the sixth lower contact plug 226 may include a lower portion 226*a* and an upper portion 226*b* stacked in the third direction D3, and the seventh lower contact plug 262 may include a lower portion 262*a* and an upper portion 262*b* stacked in the third In various example embodiments, each of the lower portions 226*a* and 262*a* of the sixth and seventh lower contact plugs 226 and 262, respectively, and each of the upper portions 226*b* and 262*b* of the sixth and seventh lower contact plugs 226 and 262 may have width gradually increasing from a bottom toward a top thereof.

Figure 26:
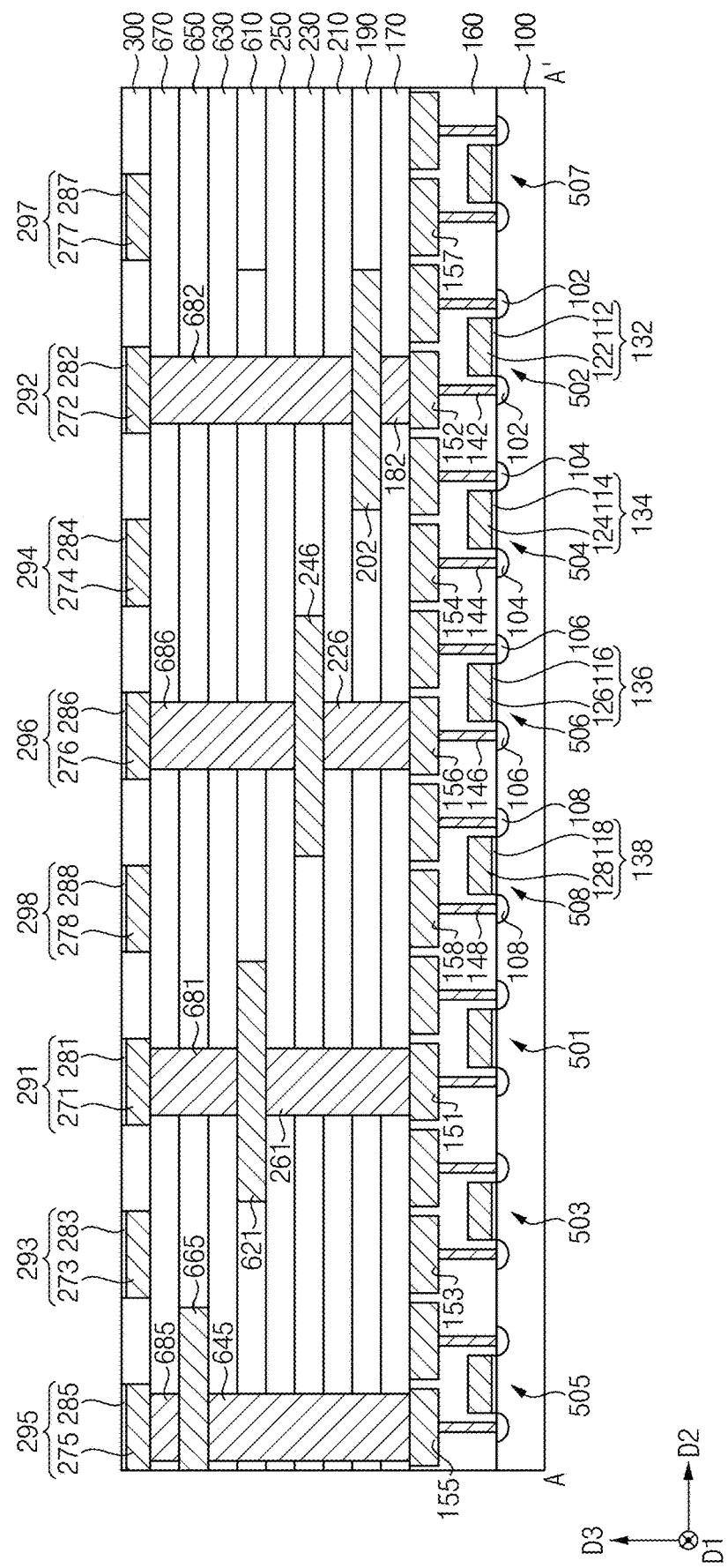
FIG. 26 is a cross-sectional views illustrating a semiconductor device in accordance with some example embodiments.

FIG. 26 is a cross-sectional views illustrating a semiconductor device in accordance with some example embodiments, which may correspond to FIG. 10. This semiconductor device may be substantially the same as or similar to that of FIGS. 1 to 4, except for the lower wirings, and thus repeated explanations are omitted herein.

Referring to FIG. 26, the semiconductor device may further include fifth to eighth transistors 501, 503, 505 and 507 in addition to the first to fourth transistors 502, 504, 506 and 508, and the first to eighth transistors 502, 504, 506, 508, 501, 503, 505 and 507 may be repeatedly formed in the second direction D2 in this order.

Additionally, the semiconductor device may further include fifth to eighth bit line structures 291, 293, 295 and 297 in addition to the first to fourth bit line structures 292, 294, 296 and 298, and the first to eight bit line structures 292, 294, 296, 298, 291, 293, 295 and 297 may be repeatedly formed in the second direction D2 in this order.

The fifth bit line structure 291 may include a fifth bit line 271 and a seventh insulation pattern 281 stacked in the third direction D3, the sixth bit line structure 293 may include a sixth bit line 273 and an eight insulation pattern 283 stacked in the third direction D3, the seventh bit line structure 295 may include a seventh bit line 275 and a ninth insulation pattern 285 stacked in the third direction D3, and the eighth bit line structure 297 may include an eight bit line 277 and a tenth insulation pattern 287 stacked in the third direction D3.

Seventh to tenth lower wirings 151, 153, 155 and 157 at the same level as the first to fourth lower wirings 152, 154, 156 and 158 may be electrically connected to the fifth to eighth transistors 501, 503, 505 and 507.

Seventh to tenth lower insulating interlayers 610, 630, 650 and 670 may be sequentially stacked in the third direction D3 between the sixth lower insulating interlayer 250 and the first to eighth bit line structures 292, 294, 296, 298, 291, 293, 295 and 297.

A ninth lower contact plug 682 may extend through the fourth to tenth lower insulating interlayers 210, 230, 250, 610, 630, 650 and 670 between the fifth lower wiring 202 and the first bit line 272, and a tenth lower contact plug 686 may extend through the sixth to tenth lower insulating interlayers 250, 610, 630, 650 and 670 between the sixth lower wiring 246 and the third bit line 276.

A third conductive structure including an eleventh lower contact plug 261, an eleventh lower wiring 621 and a twelfth lower contact plug 681 sequentially stacked in the third direction D3 may be formed on the seventh lower wiring 151 to be electrically connected to the fifth bit line 271, and thus the fifth transistor 501 may be electrically connected to the fifth bit line 271. Additionally, a fourth conductive structure including a thirteenth lower contact plug 645, a twelfth lower wiring 665 and a fourteenth lower contact plug 685 sequentially stacked in the third direction D3 may be formed on the ninth lower wiring 155 to be electrically connected to the seventh bit line 275, and thus the seventh transistor 505 may be electrically connected to the seventh bit line 275.

The eleventh lower contact plug 261 may extend through the second to sixth lower insulating interlayers 170, 190, 210, 230 and 250, and the twelfth lower contact plug 681 may extend through the eighth to tenth lower insulating interlayers 630, 650 and 670. Additionally, the thirteenth lower contact plug 645 may extend through the second to eighth lower insulating interlayers 170, 190, 210, 230, 250, 610 and 630, and the fourteenth lower contact plug 685 may extend through the tenth lower insulating interlayer 670.

In the semiconductor device, the first, third, seventh and ninth lower wirings 152, 156, 151 and 155 connected to the first, third, fifth and seventh transistors 502, 506, 501 and 505, respectively, included in the S/A circuit may be electrically connected to the first, third, fifth and seventh bit lines 272, 276, 271 and 275, respectively, and the fifth lower wiring 202 included in the first conductive structure between the first lower wiring 152 and the first bit line 272, the sixth lower wiring 246 included in the second conductive structure between the third lower wiring 156 and the third bit line 276, the eleventh lower wiring 621 included in the third conductive structure between the seventh lower wiring 151 and the fifth bit line 271, and the twelfth lower wiring 665 included in the fourth conductive structure between the ninth lower wiring 155 and the seventh bit line 275 may be formed at different levels from each other.

Thus, when compared to a case in which the fifth, sixth, eleventh and twelfth lower wirings 202, 246, 621 and 665 are formed at the same level, the distance between the fifth lower wirings 202, the distance between the sixth lower wirings 246, the distance between the eleventh lower wirings 621 and the distance between the twelfth lower wirings 665 may be greater even if the fifth, sixth, eleventh and twelfth lower wirings 202, 246, 621 and 665 have relatively large widths. Accordingly, each of the fifth, sixth, eleventh and twelfth lower wirings 202, 246, 621 and 665 may have a reduced resistance, and/or may be more easily formed.

FIGS. 1 to 4 show that the lower wiring are formed at two levels between the S/A circuit and the bit line, and FIG. 26 shows that the lower wiring are formed at four levels between the S/A circuit and the bit line, however, the inventive concept may not be limited thereto. That is, the lower wirings may be formed at a plurality of levels between the S/A circuit and the bit line.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While some inventive concepts have been shown and described with reference to various example embodiments thereof, it will be understood by those of ordinary skill in the art that various changes in form and details may be made thereto without departing from the spirit and scope of the inventive concepts as set forth by the following claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A semiconductor device comprising:
   a sense amplifier (S/A) circuit on a substrate;
   bit lines on the S/A circuit, each of the bit lines extending in a first direction substantially parallel to an upper surface of the substrate, the bit lines spaced apart from each other in a second direction substantially parallel to the upper surface of the substrate and crossing the first direction;
   a gate electrode extending in the second direction on the bit lines;
   a gate insulation pattern on a sidewall in the first direction of the gate electrode;
   a channel on a sidewall in the first direction of the gate insulation pattern, the channel contacting a corresponding one of the bit lines and including an oxide semiconductor material;
   an upper contact plug contacting an upper surface of the channel; and
   a capacitor on the upper contact plug,
   wherein,
      the bit lines include a first bit line, a second bit line, a third bit line, and a fourth bit line sequentially arranged in the second direction,
      a first lower contact plug, a first lower wiring and a second lower contact plug are sequentially stacked between the S/A circuit and the first bit line in a third direction substantially perpendicular to the upper surface of the substrate, the first lower contact plug, the first lower wiring and the second lower contact plug being electrically connected to the S/A circuit and the first bit line,
      a third lower contact plug, a second lower wiring, and a fourth lower contact plug are sequentially stacked in the third direction between the S/A circuit and the third bit line, the third lower contact plug, the second lower wiring, and the fourth lower contact plug being electrically connected to the S/A circuit and the third bit line, and
      the first and second lower wirings are arranged at different levels from each other.

2. The semiconductor device according to claim 1, wherein
   the first lower wiring is at a level lower than a level of the second lower wiring, and
   a length in the third direction of the second lower contact plug is greater than a length in the third direction of the fourth lower contact plug.

3. The semiconductor device according to claim 2, wherein
   the second lower contact plug includes a lower portion and an upper portion that are stacked in the third direction, and
   each of the lower and upper portions of the second lower contact plug has a width gradually increasing from a bottom toward a top.

4. The semiconductor device according to claim 2, wherein a length in the third direction of the first lower contact plug is less than a length in the third direction of the third lower contact plug.

5. The semiconductor device according to claim 4, wherein
   the third lower contact plug includes a lower portion and an upper portion that are stacked in the third direction, and
   each of the lower and upper portions of the third lower contact plug has a width gradually increasing from a bottom toward a top.

6. The semiconductor device according to claim 1, wherein a width in the second direction of each of the first and second lower wirings is greater than a width in the second direction of each of the bit lines.

7. The semiconductor device according to claim 1, wherein the first and second lower wirings do not overlap each other in the third direction.

8. The semiconductor device according to claim 1, wherein the first and second lower wirings partially overlap each other in the third direction.

9. The semiconductor device according to claim 1, wherein a width in the second direction of each of the second and fourth contact plugs is less than a width in the second direction of each of the bit lines.

10. The semiconductor device according to claim 1, wherein a width in the second direction of each of the second and fourth contact plugs is greater than a width in the second direction of each of the bit lines.

11. The semiconductor device according to claim 1, wherein end portions in the first direction of each of the first and second lower wirings do not overlap the bit lines in the third direction.

12. A semiconductor device comprising:
a sense amplifier (S/A) circuit on a substrate;
bit lines on the S/A circuit, each of the bit lines extending in a first direction substantially parallel to an upper surface of the substrate, the bit lines being spaced apart from each other in a second direction substantially parallel to the upper surface of the substrate and crossing the first direction;
a gate electrode extending on the bit lines in the second direction;
a gate insulation pattern on a sidewall in the first direction of the gate electrode;
a channel on a sidewall in the first direction of the gate insulation pattern, the channel contacting a corresponding one of the bit lines and including an oxide semiconductor material;
an upper contact plug contacting an upper surface of the channel; and
a capacitor on the upper contact plug,
wherein:
the bit lines include a first bit line, a second bit line, a third bit line, and a fourth bit line sequentially arranged in the second direction,
a first conductive structure is between the S/A circuit and the first bit line, the first conductive structure electrically connecting the S/A circuit and the first bit line,
a second conductive structure is between the S/A circuit and the second bit line, the second conductive structure electrically connecting the S/A circuit and the second bit line,
the first conductive structure includes:
a first lower contact plug contacting a lower surface of the first bit line; and
a first lower wiring contacting a lower surface of the first lower contact plug,
the second conductive structure includes:
a second lower contact plug contacting a lower surface of the second bit line; and
a second lower wiring contacting a lower surface of the second lower contact plug, and
lengths in a third direction of the first and second lower contact plugs are different from each other.

13. The semiconductor device according to claim 12, wherein
a length in the third direction of the first lower contact plug is greater than a length in the third direction of the second lower contact plug, and
wherein the first lower wiring is arranged at a level lower than a level of the second lower wiring.

14. The semiconductor device according to claim 13, wherein
the second lower contact plug includes a lower portion and an upper portion stacked in the third direction, and
each of the lower and upper portions of the second lower contact plug has a width gradually increasing from a bottom toward a top.

15. The semiconductor device according to claim 12, wherein the first and second lower wirings do not overlap each other in the third direction.

16. The semiconductor device according to claim 12, wherein the first and second lower wirings partially overlap each other in the third direction.

17. A semiconductor device comprising:
a sense amplifier (S/A) circuit on a substrate, the S/A circuit including transistors spaced apart from each other in a second direction substantially parallel to an upper surface of the substrate;
bit lines on the S/A circuit, each of the bit lines extending in a first direction substantially parallel to the upper surface of the substrate and crossing the second direction, the bit lines being spaced apart from each other in the second direction;
conductive structures between the transistors and the bit lines, respectively, the conductive structures electrically connecting the transistors to the bit lines, respectively;
gate electrodes spaced apart from each other in the first direction on the bit lines, each of the gate electrodes extending in the first direction;
a gate insulation pattern on a sidewall in the first direction of each of the gate electrodes;
a channel on a sidewall in the first direction of the gate insulation pattern, the channel contacting a corresponding one of the bit lines and including an oxide semiconductor material;
upper contact plugs contacting upper surfaces of the channels, respectively; and
capacitors on the upper contact plugs, respectively,
wherein,
each of the conductive structure includes,
a lower contact plug contacting a lower surface of each of the bit lines, and
a lower wiring contacting a lower surface of the lower contact plug, and ones of the lower wirings being disposed at different levels from each other.

18. The semiconductor device according to claim 17, wherein ones of the lower contact plugs have lengths different from each other in a third direction substantially perpendicular to the upper surface of the substrate.

19. The semiconductor device according to claim 17, wherein the lower wirings do not overlap each other in a third direction substantially perpendicular to the upper surface of the substrate.

20. The semiconductor device according to claim 17, wherein ones of the lower wirings partially overlap each other in a third direction substantially perpendicular to the upper surface of the substrate.

* * * * *